US012116668B2

(12) United States Patent
Andersson et al.

(10) Patent No.: US 12,116,668 B2
(45) Date of Patent: Oct. 15, 2024

(54) ATOMIC LAYER DEPOSITION REACTOR ARRANGEMENT AND A METHOD FOR OPERATING AN ATOMIC LAYER DEPOSITION REACTOR ARRANGEMENT

(71) Applicant: BENEQ OY, Espoo (FI)

(72) Inventors: Jonas Andersson, Espoo (FI); Johannes Wesslin, Espoo (FI); Pekka Soininen, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 18/475,291

(22) Filed: Sep. 27, 2023

(65) Prior Publication Data
US 2024/0043998 A1 Feb. 8, 2024

Related U.S. Application Data

(63) Continuation of application No. PCT/FI2022/050198, filed on Mar. 29, 2022.

(30) Foreign Application Priority Data

Mar. 30, 2021 (FI) ...................................... 20215372

(51) Int. Cl.
*C23C 16/455* (2006.01)
*C23C 16/44* (2006.01)

(52) U.S. Cl.
CPC .... *C23C 16/45544* (2013.01); *C23C 16/4409* (2013.01)

(58) Field of Classification Search
CPC ........... H01L 21/67126; H01L 21/6719; H01L 21/67748; C23C 16/45544; C23C 16/4409
See application file for complete search history.

(56) References Cited

U.S. PATENT DOCUMENTS

2001/0013312 A1 8/2001 Soininen et al.
2004/0089240 A1 5/2004 Dando et al.
(Continued)

FOREIGN PATENT DOCUMENTS

EP 2465972 A2 6/2012
WO 2020260767 A1 12/2020

OTHER PUBLICATIONS

International Search Report issued by the Finnish Patent and Registration Office acting as the International Searching Authority in relation to Finnish Application No. PCT/FI2022/050198 dated Jun. 30, 2022 (4 pages).
(Continued)

*Primary Examiner* — Joseph A Miller, Jr.
(74) *Attorney, Agent, or Firm* — Robert P. Michal, Esq.; Carter, DeLuca & Farrell LLP

(57) ABSTRACT

An atomic layer deposition reactor and a method for operating a reactor. The reactor includes a vacuum chamber having a loading wall provided with a loading opening, and a reactor door assembly having a reactor door. The reactor door assembly is arranged to move the reactor door between a first door position in which the reactor door is against the loading wall and arranged to close the loading opening, and a second door position in which the reactor door is spaced apart from and opposite the loading wall. The reactor door assembly is further arranged to move the reactor door between the second door position, and a third door position in which the reactor door is aside from the loading opening.

10 Claims, 21 Drawing Sheets

(56) References Cited

U.S. PATENT DOCUMENTS

2008/0019807 A1* 1/2008 Suzuki ............... H01L 21/6719
                                                    414/217
2010/0247763 A1   9/2010 Coutu et al.
2017/0148670 A1*  5/2017 Lei .................... C23C 16/45536

OTHER PUBLICATIONS

Written Opinion of the International Searching Authority issued by the Finnish Patent and Registration Office acting as the International Searching Authority in relation to Finnish Application No. PCT/FI2022/050198 dated Jun. 30, 2022 (6 pages).
Finnish Search Report issued by the Finnish Patent and Registration Office in relation to Finnish Application No. 20215372 dated Nov. 12, 2021 (2 pages).

* cited by examiner

ATOMIC LAYER DEPOSITION REACTOR ARRANGEMENT AND A METHOD FOR OPERATING AN ATOMIC LAYER DEPOSITION REACTOR ARRANGEMENT

CROSS-REFERENCE TO RELATED APPLICATIONS

This application is a continuation of PCT International Application No. PCT/FI2022/050198 filed Mar. 29, 2022, which claims priority to Finnish Patent Application No. 20215372, filed Mar. 30, 2021, the disclosure of each of these applications is expressly incorporated herein by reference in their entirety.

FIELD OF THE INVENTION

The present invention relates to an atomic layer deposition arrangement. The present invention further relates to a method for operating an atomic layer deposition arrangement.

BACKGROUND OF THE INVENTION

In prior art atomic layer deposition reactors a vacuum chamber is used for isolating the process from the environment. The vacuum chamber has a loading opening in a front wall of the vacuum chamber via which substrates or separate reaction chamber is loaded and unloaded to and from the vacuum chamber. The vacuum chamber further comprises a reactor door for closing the loading opening of the vacuum chamber during processing. The reactor door is hinged to the structures of the vacuum chamber such that it may be opened and closed by turning the reactor door around the hinge in relation to the vacuum chamber. Accordingly, the reactor door comprises a handle for manual opening and closing of the reactor door. The hinge axis is usually vertical such that the reactor door is turned horizontally around the vertical hinge axis. The substrates or separate reaction chambers are loaded from wheel carts to the vacuum chamber. The wheel carts are manually moved in front of the open loading opening and the substrates or separate reaction chambers are manually loaded from the wheel cart to the vacuum chamber, or from the vacuum chamber to the wheel cart.

One of the problems associated with the prior art is that as the vacuum chamber requires thick chamber walls and also the reactor door needs to have a thick structure. When size of the atomic layer deposition reactor increases the loading opening also increases. Therefore, larger reactor doors are required for closing the loading opening. As the size of the loading door increases more space is needed in front of the front wall of the vacuum chamber as the larger reactor door has a greater turning radius around the hinge axis. Therefore, floor space required by the atomic layer deposition apparatus in a facility increases. The larger reactor door also has a greater mass which causes structural demands for the hinges. In large atomic layer deposition reactors and vacuum chamber larger substrates and especially larger separate reaction chambers are usually utilized. The separate reaction chamber may have a weight over 1000 kg or even more when they are loaded with substrates. Thus, utilizing the wheel cart which is manually moved in front of the open loading opening is not possible.

BRIEF DESCRIPTION OF THE INVENTION

An object of the present invention is to provide an atomic layer deposition reactor arrangement and a method for operating the same so as to overcome or at least alleviate the prior art disadvantages.

The objects of the invention are achieved by an atomic layer deposition reactor arrangement. The objects of the invention are further achieved by a method for operating an atomic layer deposition reactor arrangement.

The preferred embodiments of the invention are disclosed in the dependent claims.

The invention is based on the idea of providing an atomic layer deposition reactor, the atomic layer deposition reactor comprising a vacuum chamber, the vacuum chamber comprises a loading wall provided with a loading opening, a reactor door assembly having a reactor door for closing the loading opening of the vacuum chamber.

According to the present invention the reactor door assembly is arranged to move the reactor door in relation to the vacuum chamber between a first door position in which the reactor door is against the loading wall of the vacuum chamber and the reactor door is arranged to close the loading opening, and a second door position in which the reactor door is spaced apart from and opposite the loading wall of the vacuum chamber. The reactor door assembly is arranged to move the reactor door in relation to the vacuum chamber between the second door position and a third door position in which the reactor door is aside from the loading opening.

An advantage of the reactor door assembly of the atomic layer deposition reactor arrangement is that opening of the reactor door does not take up space in front of the reactor.

In the present invention the third door position in which the reactor door is aside or laterally aside from the loading opening, means that when loading opening or the loading wall is view from the front, the reactor door is adjacent to the loading opening. Thus, in the third door position the reactor door is aside or adjacent the loading opening when viewed from the front or from the direction of the loading wall, perpendicular the loading wall. Therefore, in the third door position the reactor door is not in front or opposite loading opening.

In on embodiment, the loading opening comprises an opening centre axis extending a direction of the loading opening, the reactor door assembly is arranged to move the reactor door between the first door position and the second door position, in which second door position the reactor door is spaced apart from the loading opening in direction of the opening centre line, and the reactor door assembly is arranged to move the reactor door between the second door position and the third door position in which third door position the reactor door laterally aside from the loading opening in transverse direction relative to the opening centre line.

The advantage of reactor door assembly is that the reactor door is first moved in a direction away from the loading opening and then laterally away from the front of the loading opening. Thus, only small amount of space is required on the front of the loading opening when the reactor door is opened and closed.

In one embodiment, the reactor door assembly is arranged to move the reactor door between the first door position and the second door position with a first linear movement, and the reactor door assembly is arranged to move the reactor door between the second door position and the third door position with a second linear movement transverse to the first linear movement.

In another embodiment, the reactor door assembly is arranged to move the reactor door between the first door position and the second door position with a first linear movement, and the reactor door assembly is arranged to move the reactor door between the second door position and the third door position with a second rotational movement transverse to the first linear movement.

In a further alternative embodiment, the reactor door assembly is arranged to move the reactor door between the first door position and the second door position with a first rotational movement, and the reactor door assembly is arranged to move the reactor door between the second door position and the third door position with a second linear movement.

In a yet further embodiment, the reactor door assembly is arranged to move the reactor door between the first door position and the second door position with a first rotational movement, and the reactor door assembly is arranged to move the reactor door between the second door position and the third door position with a second rotational movement.

The combination of the first and second movement of the reactor door enables opening and closing the loading door efficiently such that only small amount of space is required on the front of the loading wall and the loading opening.

In one embodiment, the reactor door assembly comprises a door support structure, the reactor door being supported to the door support structure, and that the door support structure is arranged stationary in relation to the vacuum chamber, the reactor door is arranged movable to the door support structure, and the reactor door assembly is arranged to move the reactor door in the door support structure between the first door position and second door position and between the second door position and third door position.

In an alternative embodiment, the reactor door assembly comprises a door support structure, the reactor door being supported to the door support structure, and that the door support structure is arranged movable in relation to the vacuum chamber, the reactor door is arranged stationary to the door support structure, and the reactor door assembly is arranged to move the door support structure in relation to the vacuum chamber such that the reactor door is moved between the first door position and second door position and between the second door position and third door position.

In a further alternative embodiment, the reactor door assembly comprises a door support structure, the reactor door being supported to the door support structure, and that the door support structure is arranged movable in relation to the vacuum chamber, the reactor door is arranged movable to the door support structure, the reactor door assembly is arranged to move the door support structure in relation to the vacuum chamber such that the reactor door is moved between the first door position and second door position, the reactor door assembly is arranged to move the reactor door in the door support structure between the second door position and third door position.

In a yet further embodiment, the reactor door assembly comprises a door support structure, the reactor door being supported to the door support structure, and that the door support structure is arranged movable in relation to the vacuum chamber, the reactor door is arranged movable to the door support structure, the reactor door assembly is arranged to move the reactor door in the door support structure between the first door position and second door position, and the reactor door assembly is arranged to move the door support structure in relation to the vacuum chamber such that the reactor door is moved between the second door position and third door position.

The door support structure enables simple structures and mechanics for moving the reactor door without providing additional and complicated alterations to the vacuum chamber.

In one embodiment, the reactor door assembly comprises a support structure moving mechanism arranged to move the door support structure relative to the vacuum chamber towards and away from the loading wall of the vacuum chamber for moving the reactor door between the first door position and the second door position.

Moving the door support structure relative to the vacuum chamber towards and away from the loading wall of the vacuum chamber enables moving the reactor door against the loading door for closing the loading opening and moving the reactor door spaced apart and opposite the loading wall without moving the loading door in the support structure.

In one embodiment, the support structure moving mechanism is arranged to move the door support structure relative to the vacuum chamber towards and away from the loading wall of the vacuum chamber between a first support structure position and a second support structure position for moving the reactor door between the first door position and the second door position.

In an alternative embodiment, the support structure moving mechanism is provided with a horizontal pivot axis, the support structure moving mechanism is arranged to tilt the door support structure around the horizontal pivot axis relative to the vacuum chamber towards and away from the loading wall of the vacuum chamber between a first support structure position and a second support structure position for moving the reactor door between the first door position and the second door position.

In a further embodiment, the support structure moving mechanism is provided with a vertical pivot axis, the support structure moving mechanism is arranged to turn the door support structure around the vertical pivot axis relative to the vacuum chamber towards and away from the loading wall of the vacuum chamber between a first support structure position and second support structure position for moving the reactor door between the first door position and the second door position.

The reactor door is moved between the first door position and the second door position by moving the door support structure between the first support structure position and the second support structure position.

In one embodiment, the door support structure comprises one or more vertical support elements and one or more lower support elements, the one or more vertical support elements are pivotably connected to the one or more lower support elements with one or more horizontal pivot axis and arranged to extend upwards from the one or more lower support elements, the reactor door is supported to the one or more vertical support elements.

In an alternative embodiment, the door support structure comprises one or more vertical support elements and one or more vertical pivot axis, the reactor door is supported to the one or more vertical support elements.

In a further embodiment, the door support structure comprises one or more vertical support elements, the reactor door is supported to the one or more vertical support elements.

The vertical support elements enable supporting the reactor door at a height of the loading opening.

In one embodiment, the door support structure comprises a first vertical support element and a second vertical support element, the first and second vertical support element are arranged spaced apart from each other such that a loading space is formed between the first and second vertical support elements, and the reactor door is supported to the first and second vertical support elements and arranged to the loading space between the first and second vertical support element.

In an alternative embodiment, the door support structure comprises a first vertical support element and a second vertical support element, the first and second vertical support element are arranged are spaced apart from each other such that a loading space is formed between the first and second vertical support elements, the first and second vertical support elements being arranged on the front of the loading wall of the vacuum chamber such that the first and second vertical support elements are on opposite sides of the loading opening of the vacuum chamber, and the reactor door is supported to the first and second vertical support elements and arranged to the loading space between the first and second vertical support element.

The reactor door is supported between the first and second vertical support elements such that the reactor door may be moved away from the loading space and on the front of the loading wall for arranged in the space in front of the loading opening clear or unoccupied for loading and unloading.

In one embodiment, the reactor door assembly comprises a door moving mechanism arranged to move the reactor door in the door support structure relative to the door support structure between the second door position and the third door position.

The door moving mechanism enables moving the reactor door in the door support structure relative to the door support structure and relative to the vacuum chamber.

In one embodiment, the door moving mechanism is arranged to move the reactor door in the door support structure relative to the door support structure in direction of a planar door surface or transverse to the opening centre line of the loading door between the second door position and the third door position.

In an alternative embodiment, the door moving mechanism is arranged to move the reactor door in the door support structure relative to the door support structure with the second linear movement between the second door position and the third door position.

In an alternative embodiment, the door moving mechanism is arranged to move the reactor door in the door support structure relative to the door support structure with the second linear movement in direction of a planar door surface or transversely to the opening centre line of the loading door between the second door position and the third door position.

In a further embodiment, the door moving mechanism comprises a door axis and is arranged to turn the reactor door in the door support structure around the door axis relative to the door support structure with the second rotational movement between the second door position and the third door position.

In a yet alternative embodiment, the door moving mechanism comprises a door axis extending perpendicularly to a planar door surface of the loading door, and the door moving mechanism is arranged to turn the reactor door in the door support structure around the door axis relative to the door support structure with the second rotational movement between the second door position and the third door position.

The door moving mechanism is arranged to move the reactor door in the door support structure aside from the loading opening.

In one embodiment, the door moving mechanism is arranged to move the reactor door in the one or more vertical support elements between the second door position and the third door position.

In an alternative embodiment, the door moving mechanism is arranged to move the reactor door in the one or more vertical support elements between the second door position and the third door position.

In a further embodiment, the door moving mechanism is arranged to move the reactor door in the one or more vertical support elements between the second door position in which the reactor door is spaced apart from and opposite the loading wall of the vacuum chamber and the third door position in which the reactor door is below, above or laterally adjacent the loading opening.

In a yet alternative embodiment, the door moving mechanism is arranged to move the reactor door along the first and second vertical support elements in the loading space between the second door position and the third door position.

In another further embodiment, the door moving mechanism is arranged to move the reactor door along the first and second vertical support elements in the loading space between the second door position in which the reactor door spaced apart from and opposite the loading wall of the vacuum chamber and the third door position in which the reactor door is below or above the loading opening.

Accordingly, the door moving mechanism is arranged o move the reactor door aside from the front of the loading opening in lateral direction.

The present invention also relates to a method for operating an atomic layer deposition reactor arrangement. The reactor arrangement comprises an atomic layer deposition reactor having a vacuum chamber, the vacuum chamber comprises a loading wall provided with a loading opening, and a reactor door assembly having a reactor door for closing the loading opening of the vacuum chamber.

The reactor door assembly comprises a door support structure, the reactor door is supported to the door support structure.

According to the present invention the method comprises moving the reactor door with a first movement relative to the atomic layer deposition reactor between a first door position in which the reactor door is against the loading wall of the vacuum chamber and the reactor door is arranged to close the loading opening, and a second door position in which the reactor door is spaced apart and opposite the loading wall of the vacuum chamber, and moving the reactor door with a second movement relative to the atomic layer deposition reactor between the second door position and a third door position in which the reactor door is aside from the loading opening.

The method enables opening and closing the loading opening by moving the reactor door in limited space in front of the loading wall.

In one embodiment, the method comprises moving the reactor door in a direction towards and away from the loading wall of the vacuum chamber with the first movement relative to the atomic layer deposition reactor between the first door position and the second door position.

In another embodiment, the method comprises moving the reactor door in a direction towards and away from the loading wall of the vacuum chamber with the first movement relative to the atomic layer deposition reactor between the first door position and the second door position, the first movement being a first linear movement.

In a further embodiment, the method comprises moving the reactor door in a direction towards and away from the loading wall of the vacuum chamber with the first movement relative to the atomic layer deposition reactor between the first door position and the second door position, the first movement being a first rotational movement.

The first movement enables spacing the reactor door apart from the loading wall such that the reactor may be moved laterally away from the loading opening.

In one embodiment, the method comprises moving the reactor door with the second movement relative to the atomic layer deposition reactor in a transverse direction relative to direction of the first movement between the second door position and the third door position.

In another embodiment, the method comprises moving the reactor door with the second movement relative to the atomic layer deposition reactor in a transverse direction relative to direction of the first movement between the second door position and the third door position, the second movement being a second linear movement.

In a further embodiment, the method comprises moving the reactor door with the second movement relative to the atomic layer deposition reactor in a transverse direction relative to direction of the first movement between the second door position and the third door position, the second movement being a second rotational movement.

The second movement enables moving the reactor door laterally away from the front of the loading opening such that only limited space is required.

In one embodiment, the reactor door assembly comprises a door support structure, the reactor door being supported to the door support structure. The method comprises moving the reactor door in the door support structure relative to the vacuum chamber between the first door position and second door position with the first movement and between the second door position and third door position with the second movement.

In another embodiment, the reactor door assembly comprises a door support structure, the reactor door being supported to the door support structure. The method comprises moving the door support structure in relation to the vacuum chamber for moving the reactor door relative to the vacuum chamber between the first door position and second door position with the first movement, and moving the reactor door in the door support structure relative to the vacuum chamber between the second door position and third door position with the second movement.

In a further embodiment, the reactor door assembly comprises a door support structure, the reactor door being supported to the door support structure. The method comprises moving the reactor door in the door support structure in relation to the vacuum chamber between the first door position and second door position with the first movement, and moving the door support structure in relation to the vacuum chamber for moving the reactor door relative to the vacuum chamber between the second door position and third door position with the second movement.

In a yet further embodiment, the reactor door assembly comprises a door support structure, the reactor door being supported to the door support structure. The method comprises moving the door support structure in relation to the vacuum chamber for moving the reactor door relative to the vacuum chamber between the first door position and second door position with the first movement, and moving the door support structure in relation to the vacuum chamber for moving the reactor door in the door support structure relative to the vacuum chamber between the second door position and third door position with the second movement.

Utilizing the first and second movements, it is possible to open the loading opening and move reactor door away from the loading opening, as well as close the loading opening and move the reactor door against the loading wall, in limited space with two movements.

In one embodiment, the method comprises moving the door support structure between a first structure position in which the reactor door is in the first door position and a second structure position in which the reactor door is in the second door position with the first movement by transferring the door support structure relative to the atomic layer deposition reactor in a direction towards and away from the loading wall of the vacuum chamber.

In an alternative embodiment, the method comprises moving the door support structure between a first structure position in which the reactor door is in the first door position and a second structure position in which the reactor door is in the second door position with the first movement by tilting the door support structure relative to vertical direction.

In a further embodiment, the method comprises moving the door support structure between a first structure position in which the reactor door is in the first door position and a second structure position in which the reactor door is in the second door position with the first movement by turning the door support structure relative to the loading wall of the vacuum chamber.

By moving the door support structure relative to the vacuum chamber enables moving the reactor door between the first and second door positions for opening and closing the loading opening.

In some embodiments, the door support structure comprises a first vertical support element and a second vertical support element, the first and second vertical support elements are arranged spaced a part from each other in horizontal direction on opposite sides of the loading opening such that a loading space is formed between the first and second vertical support elements, the reactor door is supported to the first and second vertical support elements and arranged to the loading space.

In one embodiment, the method comprises moving the reactor door in the door support structure relative to the atomic layer deposition reactor along the first and second vertical support elements in the loading space between the second door position in which the reactor door is in the loading space opposite the loading opening, and the third door position in which the reactor door is in vertical direction below or above the loading opening.

In another embodiment, the method comprises moving the door support structure between the first structure position and the second structure position comprises tilting the first and second vertical support elements relative to the loading wall of the vacuum chamber for moving the reactor door between the first door position and the second door position, and moving the reactor door in the door support structure relative to the atomic layer deposition reactor along the first and second vertical support elements in the loading space between the second door position in which the reactor door is in the loading space opposite the loading opening, and the third door position in which the reactor door is in vertical direction below or above the loading opening.

The tilting vertical support elements and the moving the reactor door along the vertical support elements provides simple and effective construction in which the movement of the reactor and required space may be minimized.

In one embodiment, the method comprises moving the reactor door in the door support structure with the second movement between the second door position and the third door position is carried out in the second structure position of the door support structure.

In another embodiment, the method comprises moving the reactor door in the door support structure with the second movement between the second door position and the third door position is started during moving the door support structure between the first structure position and the second structure position with the first movement.

The second movement is carried out when the reactor door is disengaged from the loading opening such that it may move in lateral direction.

In some embodiments the method comprises opening a closed the vacuum chamber, in which closed vacuum chamber the door support structure is in the first structure position and the reactor door is in the first door position and arranged against the loading wall of the vacuum chamber such that the reactor door is arranged to close the loading opening.

In one embodiment, the opening of the closed vacuum chamber comprises moving the door support structure relative to the vacuum chamber from the first structure position to the second structure position by moving the door support structure in a direction away from the loading wall of the vacuum chamber for moving the reactor door from the first door position to the second door position, and moving the reactor door in the door support structure from the second door position to the third door position by moving the reactor door in the door support structure arranged to the second structure position.

In an alternative embodiment, the opening of the closed vacuum chamber comprises moving the door support structure relative to the vacuum chamber from the first structure position to the second structure position by tilting or turning the door support structure in a direction away from the loading wall of the vacuum chamber for moving the reactor door from the first door position to the second door position, and moving the reactor door in the door support structure from the second door position to the third door position by moving the reactor door downwards or upwards in the door support structure arranged to the second structure position and in vertical direction below or above the loading opening.

The opening of the closed vacuum chamber is carried out with two different movements allowing minimal space in front of the loading opening.

In some embodiments, the method comprises closing an open the vacuum chamber, in which open vacuum chamber the door support structure is in the second structure position and the reactor door is in the third door position such that the loading opening is open.

In one embodiment, the closing of the open vacuum chamber comprises moving the reactor door in the door support structure from the third door position to the second door position by moving the reactor door in the door support structure arranged to the second structure position, and moving the door support structure relative to the vacuum chamber from the second structure position to the first structure position by moving the door support structure in a direction towards the loading wall of the vacuum chamber for moving the reactor door from the second door position to the first door position.

In an alternative embodiment, the closing of the open vacuum chamber comprises moving the reactor door in the door support structure from the third door position to the second door position by moving the reactor door upwards or downwards in the door support structure arranged to the second structure position, and moving the door support structure relative to the vacuum chamber from the second structure position to the first structure position by tilting or turning the door support structure in a direction towards the loading wall of the vacuum chamber for moving the reactor door from the second door position to the first door position.

Closing the vacuum chamber by moving the loading door with two movements allows closing the loading opening in tight manner in small space.

In one embodiment, the method comprises loading a reaction chamber into to the vacuum chamber when the reactor door is in the third door position such that the loading opening is open, and unloading the reaction chamber from the vacuum chamber when the reactor door is in the third door position such that the loading opening is open.

In another embodiment, the method comprises loading a reaction chamber into to the vacuum chamber when the door support structure is in the second structure position and the reactor door is in the third door position such that the loading opening is open, and unloading a reaction chamber from the vacuum chamber when the door support structure is in the second structure position and the reactor door is in the third door position such that the loading opening is open.

In a further alternative embodiment, loading a reaction chamber into to the vacuum chamber in horizontal direction when the door support structure is in the second structure position and the reactor door is in the third door position such that the loading opening is open, and unloading a reaction chamber from the vacuum chamber in horizontal direction when the door support structure is in the second structure position and the reactor door is in the third door position such that the loading opening is open.

Thus, a separate reaction chamber is loaded inside the vacuum chamber for processing substrates, and unloaded from the vacuum chamber after the processing.

In some embodiments, the method is carried out by utilizing the above disclosed atomic layer deposition reactor.

According to the invention the method comprises operating an atomic layer deposition reactor arrangement according to any one of the embodiments described before.

An advantage of the invention is that the separate reactor supported to the door support frame enables opening and closing the vacuum chamber by moving the whole reactor door away from loading opening in vertical direction. Therefore, space opposite the loading opening becomes free such that a separate reactor chamber may be loaded into the vacuum chamber in horizontal direction. Further, as the reactor door slides away from the loading wall of the vacuum chamber, opening the reactor door requires minimal space in front of the loading wall. Accordingly, floor space in the facility may be decreased. Further, a stationary loading assembly may be arranged close to the loading wall of vacuum chamber. This enables automated loading and unloading of separates reaction chamber to and from the vacuum chamber via the loading opening. Therefore, utilizing as well as loading and unloading large heavy separate reaction chamber becomes possible.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
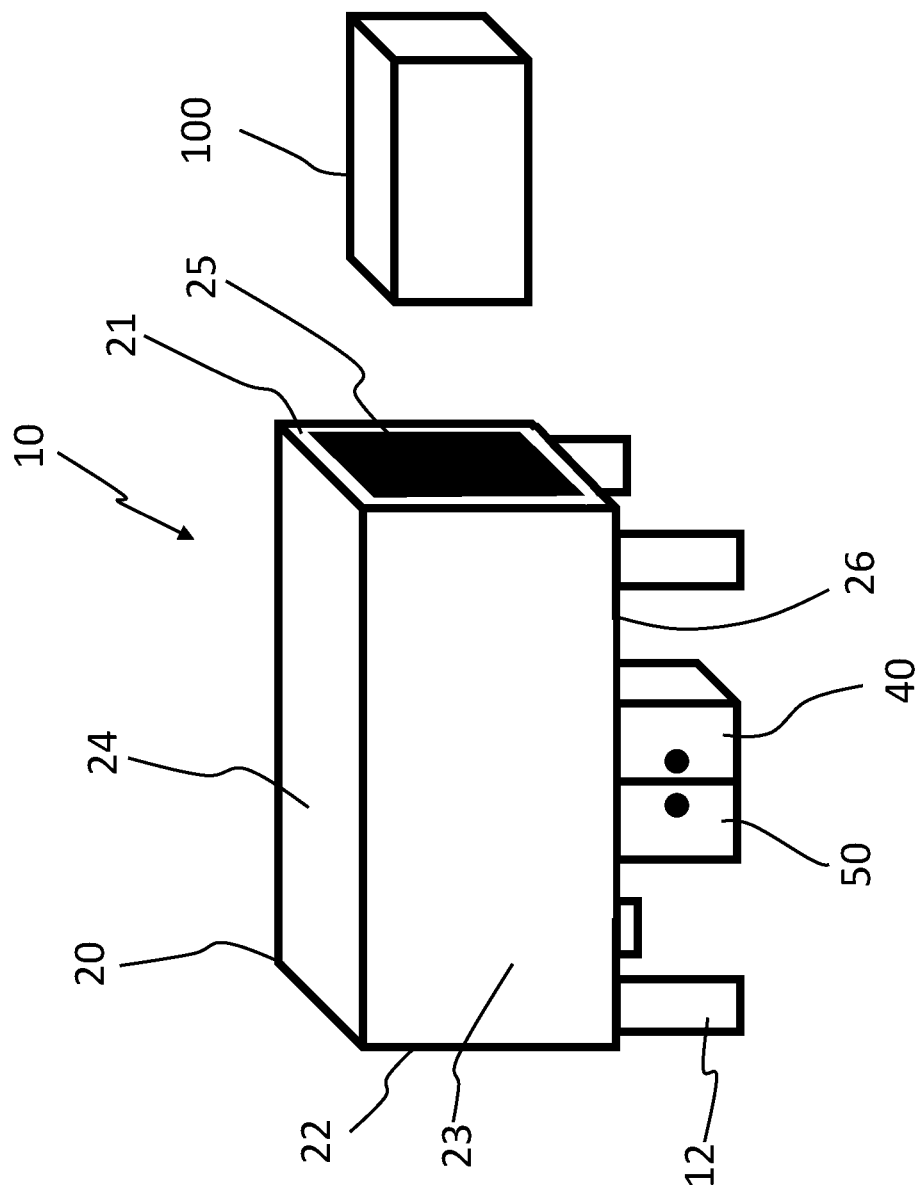
FIGS. 1 to 4 show schematically one embodiment of an atomic layer deposition reactor according to the present invention.

FIG. 1 shows schematically an atomic layer deposition reactor arrangement having an atomic layer deposition reactor 10.

The atomic layer deposition reactor 10 comprises a vacuum chamber 20 having a front wall 21 provided with a loading opening 25 for loading and unloading substrates or separate reaction chambers inside and from the vacuum chamber 20. The front wall 21 is a vertically or upwards extending front wall 21. The loading opening 25 provides an opening between inside of the vacuum chamber 20 and outside of the vacuum chamber 20.

The front wall 21 provided with the loading opening 25 forms a loading wall 21 of the vacuum chamber 20.

The vacuum chamber 20 further comprises a back wall 22 opposite the front wall 21, a top wall 24, a bottom wall 26 opposite top wall 24, and side walls 23 extending between the front wall 21 and the back wall 22 and between the top wall 24 and the bottom wall 26.

In an alternative embodiment, the vacuum chamber 20 may be cylindrical vacuum chamber extending in horizontal direction. The top wall 24, bottom wall 26 and the side walls are replaced by a cylindrical sheath wall extending between the front wall 21 and the back wall 22.

The vacuum chamber walls 21, 22, 23, 24, 26 are provided structurally vacuum sustainable. Thus, the vacuum chamber walls 21, 22, 23, 24, 26 are arranged to sustain considerable vacuum conditions during processing without damaging.

The atomic layer deposition reactor 10 comprises chamber support legs 12 for supporting the vacuum chamber 20 on a support surface, such as a facility floor. The chamber support legs 12 are provided such that the vacuum chamber 20 and the loading opening 25 are arranged at a handling height from the support surface enabling loading and unloading of substrates or separate reaction chambers into and from the vacuum chamber without need to lift or move the substrates or separate reaction chambers in vertical direction.

The chamber support legs 12 are provided under the vacuum chamber 20. The chamber support legs 12 extend from and are provided to the bottom surface 26 of the vacuum chamber 20.

It should be noted that the chamber support legs 12 may be replaced with any suitable support members arranged to support the vacuum chamber 20 on the support surface.

The atomic layer deposition reactor 10 further comprises a precursor system 40 arranged to supply one or more precursor gases to a reaction chamber inside the vacuum chamber 20 and to discharge precursor gases from the reaction chamber inside the vacuum chamber 20. The precursor system 40 comprises one or more precursor sources (not shown), supply conduits (not shown), discharge conduits (not shown) and one or more supply and/or discharge pumps (not shown). The precursor system 40 is arranged to subject the surfaces of the substrates to one or more precursor gases inside the vacuum chamber 20 and the reaction chamber.

The atomic layer deposition reactor 10 further comprises vacuum system 50 arranged to provide vacuum inside vacuum chamber 20 when the loading opening 25 is closed. The vacuum system 50 comprises one or more vacuum devices such as vacuum pumps for generating the vacuum conditions inside the vacuum chamber 20.

It should be noted that in some embodiment, the vacuum chamber 20 forms also the reaction chamber.

Figure 2:
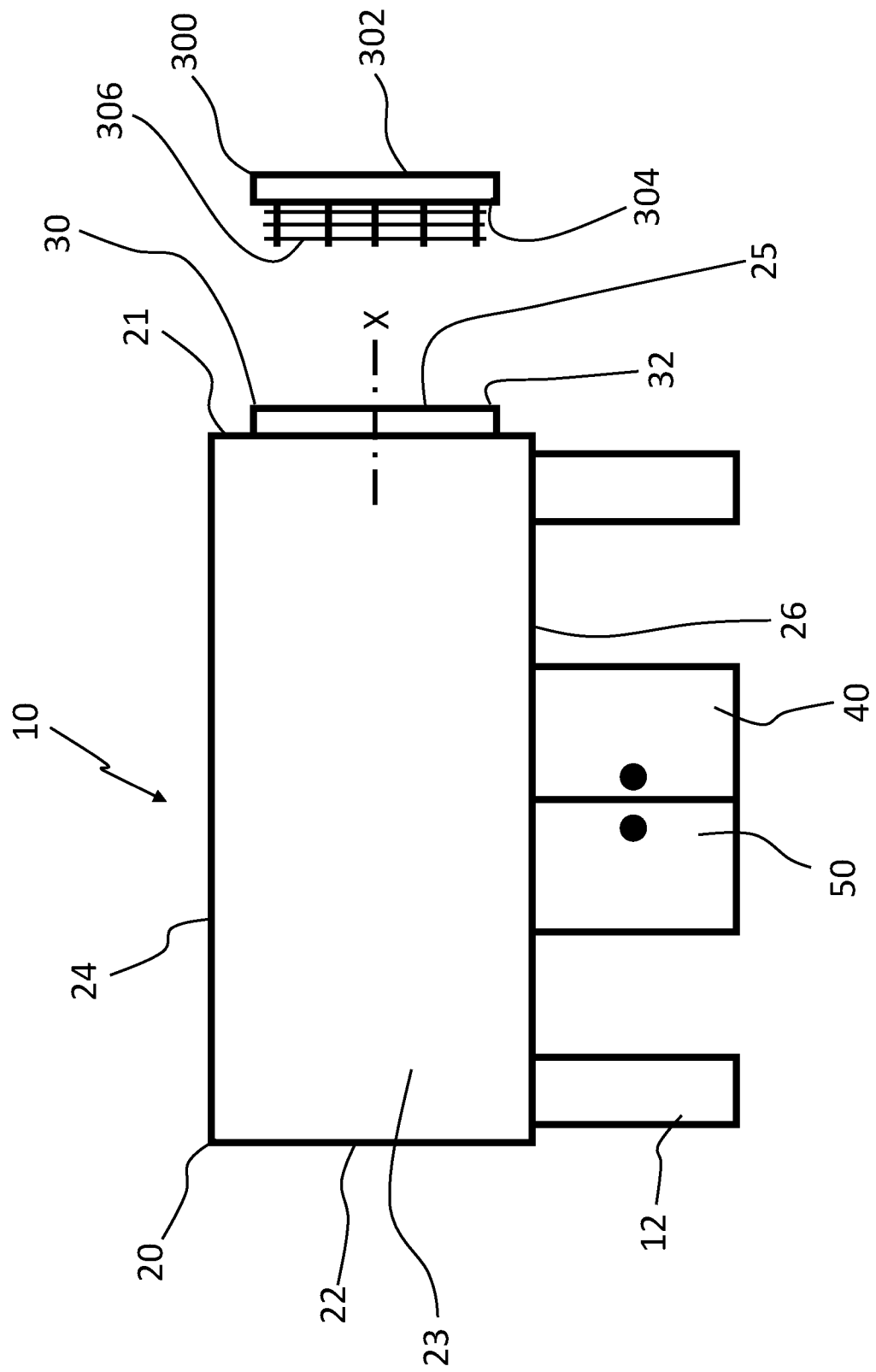

FIG. 2 shows a schematic side view of the atomic layer deposition reactor 10 and the vacuum chamber 20 thereof. FIG. 2 further shows a separate reactor door 300 arranged to close the loading opening 25 of the vacuum chamber 20.

The front wall, the loading wall, 21 of the vacuum chamber 20 comprises the loading opening 25. The from wall 21 is provided with a sealing collar or sealing flange 30 protruding from the outer surface of the front wall 21. The sealing flange 30 is arranged to surround the loading opening 25 or the sealing flange 30 is arranged to circumferentially surround the loading opening 25. Thus, the loading opening 25 is provided inside the circumferential sealing flange 30.

The sealing flange 30 comprises a first sealing surface 32. The first sealing surface is arranged to face away from the front wall 21. Preferably, the sealing surface 32 is provided parallel to the outer surface of the front wall 21.

In some embodiments, the sealing flange 30 may be omitted and the front wall 21, or outer surface of the front wall 21, of the vacuum chamber 20 is arranged to form the first sealing surface.

The first sealing surface 32 may be provided with additional sealing elements (not shown) such as O-ring or the like.

The reactor door 300 is a separate reactor door. The separate reactor door 300 means that the reactor door 300 is not fixedly connected or attached or secured to the vacuum chamber 20, but may be freely moved as whole in relation to the vacuum chamber 20.

In an alternative embodiment, the reactor door 300 is fixedly connected or attached or secured to the vacuum chamber 20 and arranged movable in relation to the vacuum chamber 20.

The reactor door 300 comprises an outer door surface 302 arranged to face away from the vacuum chamber 20 when the reactor door is installed in closed position to the loading opening 25. The reactor door 300 further comprises an inner door surface 304 facing towards the vacuum chamber 20 when the reactor door is installed in closed position to the loading opening 25.

The inner door surface 304 is provided with one or more heat reflector plates 306 arranged to reflect heat radiation towards the inner space of the vacuum chamber 20 and preventing the reactor door 300 from excessive heating. The heat reflector plates 306 are parallel to the inner door surface 304. Alternatively or additionally, the heat reflector plates 306 are parallel to the front wall 21 of the vacuum chamber 20.

The heat reflector plates 306 are arranged to fit inside the loading opening 25 and/or inside the vacuum chamber 20 when the reactor door 300 is arranged to closed position against the loading wall 21 or the first sealing surface 32.

Accordingly, in the closed position of the reactor door 300, the heat reflector plates 306 are inside the loading opening 25.

The reactor door 300 comprises a second sealing surface facing towards the front wall 21 and the loading opening 25 when the reactor door 300 is in closed position closing the loading opening 25. The second sealing surface is arranged to be placed against the first sealing surface 32 when the loading opening 25 is closed and the reactor door 300 in closed position.

The inner door surface 304 forms a second sealing surface. Alternatively, the inner door surface 304 is provided with a separate circumferential sealing surface. The second sealing surface 304 is arranged to be placed against the first sealing surface 32 of the sealing flange 30 when the reactor door is arranged to the loading opening 25 for closing the loading opening 25.

The second sealing surface 304 may be provided with additional sealing elements (not shown) such as O-ring or the like.

In a closed position of the reactor door 300, the second sealing surface 304 of the reactor door 300 is arranged against the first sealing surface 32 of the sealing flange 30 or the front wall 21 and the reactor door 300 is arrange over the loading opening 25 such that the reactor door 300 covers and closes the loading opening 25.

Figure 3:
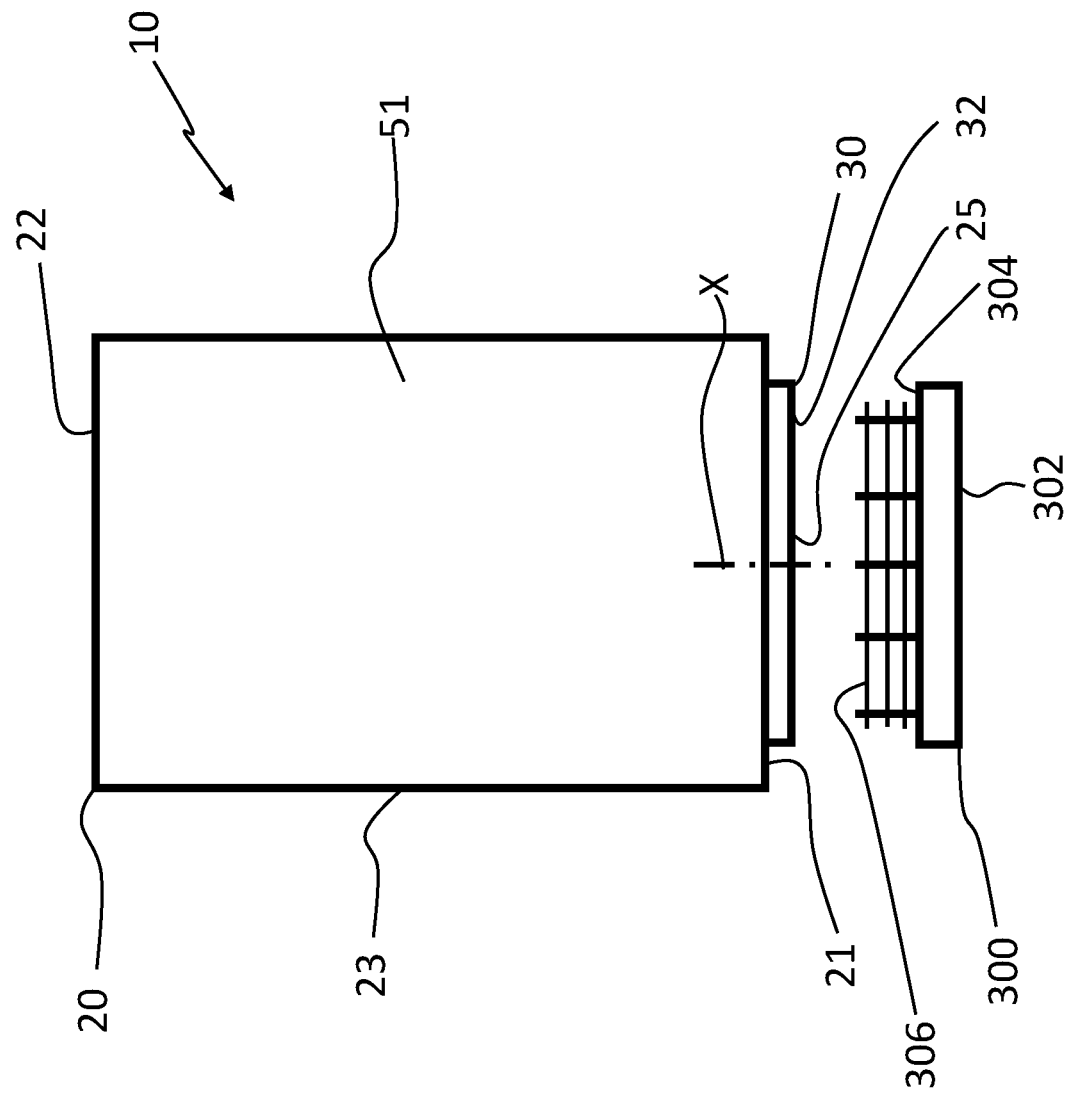

FIG. 3 shows a top view of the vacuum chamber 20 and the reactor door 300.

Figure 4:
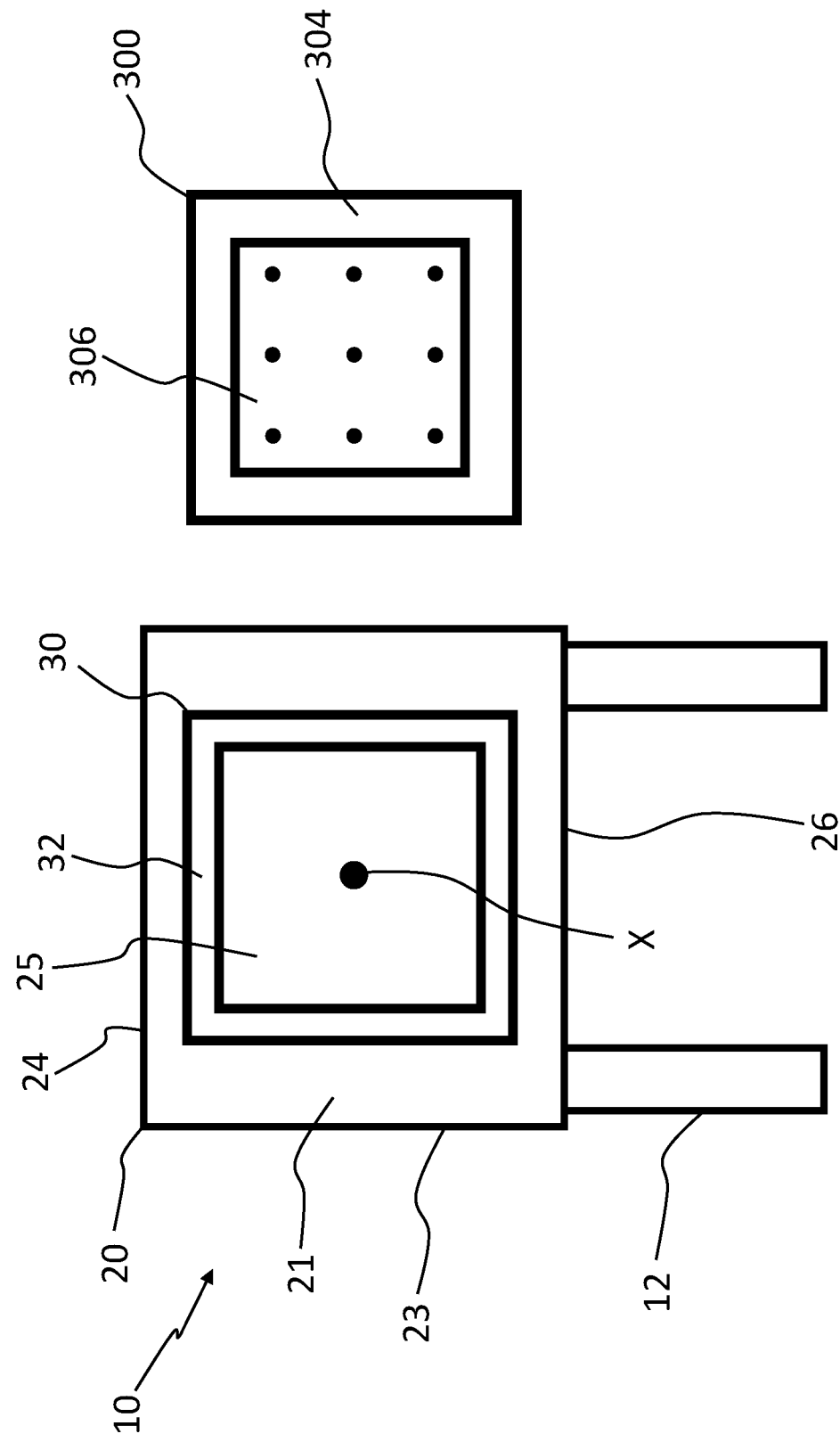

FIG. 4 shows an end view of the vacuum chamber 20 from the direction of the front wall 21. FIG. 4 further shows the separate reactor door 300.

The reactor door 300 is arranged to be placed against the front wall 21 and the sealing flange 30 for closing the loading opening 25. In the closed position of the reactor door 300, the second sealing surface 304 of the reactor door 300 is arranged against the first sealing surface 32 of the front wall 21 such that the reactor door 300 closes and seals the loading opening 25.

The heat reflector plates 306 of the reactor door 30 are arranged to fit and to the arranged into the loading opening 25 when the reactor door 300 is arranged to the closed position.

Figure 5:
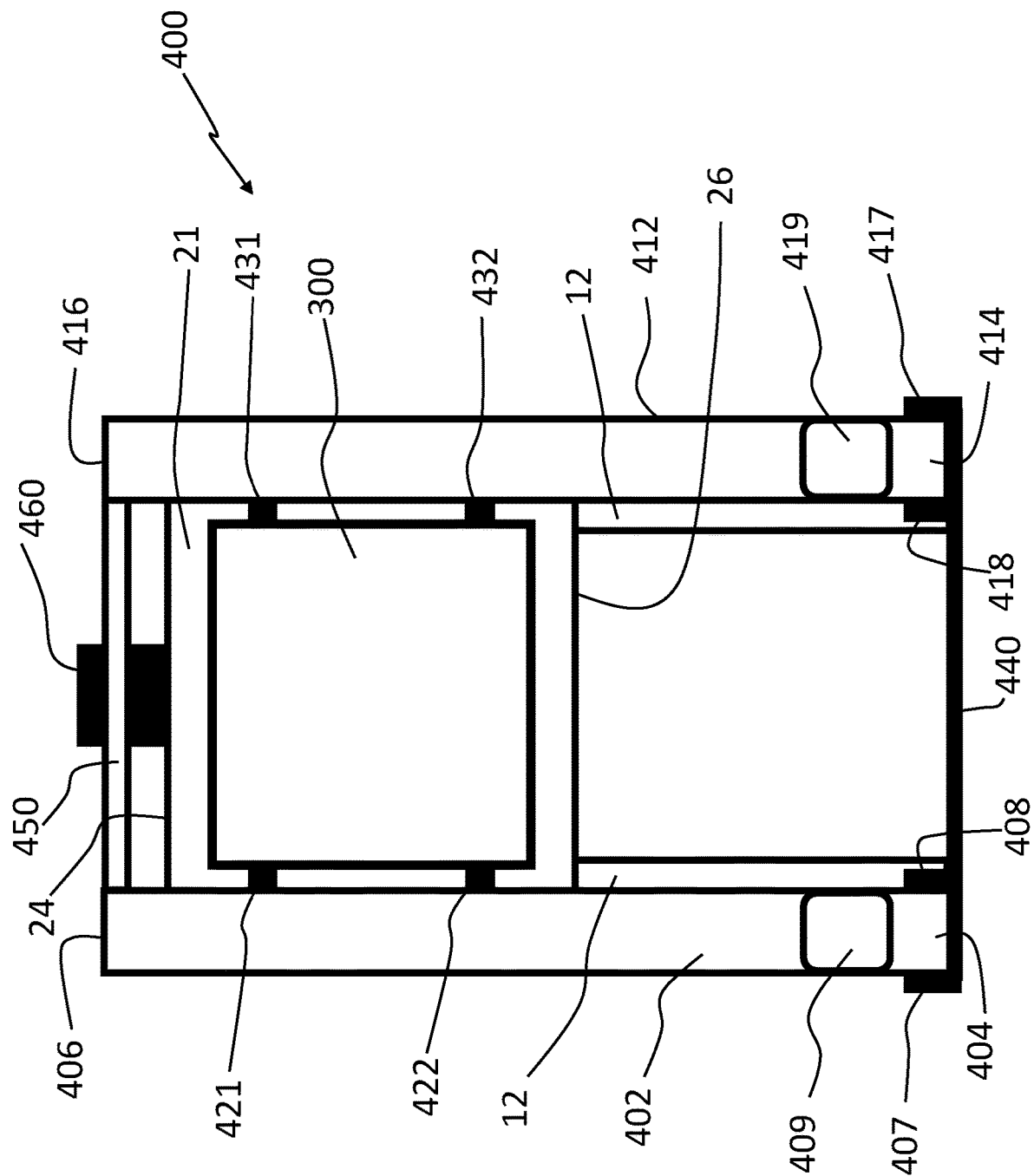
FIGS. 5 to 9 show schematically one embodiment of a reactor door assembly according to the present invention.

FIG. 5 shows schematically a more detailed view of one embodiment of the atomic layer deposition reactor according to the present invention. In this embodiment he reactor door 300 is provided as a separate reactor door 300, separate from the vacuum chamber 20.

Therefore, the atomic layer deposition reactor arrangement comprises a reactor door assembly 400. The reactor door assembly 400 comprises a door support structure 402, 412, 440, 450 and the reactor door 300. The reactor door assembly 400 is arranged to support the reactor door 300 separately from the vacuum chamber 20. The reactor door 300 is supported to the door support structure 402, 412, 440, 450.

The reactor door 300 is supported to the door support structure 402, 412, 440, 450 such that the reactor door 300 is movable relative to the vacuum chamber 20 for closing and opening the loading opening 25 with the reactor door 300. The door support structure 402, 412, 440, 450 is separate from the vacuum chamber 200.

The reactor door assembly 400 is arranged to move the reactor door 300 relative to the vacuum chamber 20 between a first door position in which the reactor door 300 is against the loading wall 21 and a second door position in which the reactor door 300 is spaced apart form the loading wall 21 in front of the loading opening 25 and opposite the loading opening 25 or the loading wall 21. In the first door position the reactor door 300 is in the closed position.

The reactor door assembly 400 is further arranged to move the reactor door 300 relative to the vacuum chamber 20 between the second door position and a third door position in which the reactor door 300 is aside from the loading opening 20. In the third door position the reactor door 300 is laterally spaced apart from the loading opening 25.

The FIG. 5 shows an end view of the vacuum chamber 20 and the reactor door assembly 400 from the direction of the loading wall 21.

As shown in FIG. 5, the door support structure 402, 412, 440, 450 is arranged in connection with the loading wall 21 of the vacuum chamber 20. The door support structure 402, 412, 440, 450 is arranged to support the reactor door 300 on the front side of the loading wall 21 such that the loading opening 25 is closable with the reactor door 300 supported to the support structure 402, 412, 440, 450.

The door support structure comprises one or more lower support elements 440, 407, 408, 417, 418. The lower support elements 440, 407, 408, 417, 418 are secured to the support surface, such as the facility floor.

Alternatively, the one or more lower support elements 440, 407, 408, 417, 418 are secured to structure of the atomic layer deposition reactor 10 or the vacuum chamber 20.

In some embodiments, the one or more lower support elements 440, 407, 408, 417, 418 are secured to the chamber support legs 12.

The door support structure comprises a first vertical support element 402 and a second vertical support element 412. The first and second vertical support elements 402, 412 are connected and supported to the one or more lower support elements 440, 407, 408, 417, 418. The first and second vertical support elements 402, 412 are arranged to extend in a direction upwards from the lower support elements 440, 407, 408, 417, 418.

The first vertical support element 402 comprises a first lower end 404 and a first upper end 406. The second vertical support element 412 comprises a second lower end 401 and a second upper end 416. The first and second vertical support elements 402, 412 are connected and supported to the one or more lower support elements 440, 407, 408, 417, 418 from the first and second lower ends 404, 414.

The first and second vertical support elements 402, 412 extend in vertical direction above the loading opening 25. Thus, the first and second upper ends 406, 416 are in vertical direction above the loading opening 25.

In preferred embodiment, the first and second vertical support elements 402, 412 extend in vertical direction above the top wall 24 of the vacuum chamber 20 when the reactor door 300 is the first door position.

The first and second vertical support element 402, 412 are arranged spaced apart from each other such that a loading space is formed between the first and second vertical support elements 402, 412. Thus, the first and second upper ends 406, 416 are in vertical direction above the top wall 24 o the vacuum chamber 20.

The longitudinal lower support element 440 is arranged to extend between the first and second vertical support elements 402, 412. The longitudinal lower support element 440 is further secured to the support surface, or the reactor 10 or the vacuum chamber 20. The first and second vertical support elements 402, 412 extend upwards from the longitudinal lower support element 440.

The first vertical support element 402 is further secured to the longitudinal lower support element 440 with first support connectors 407, 408. The second vertical support element 412 is further secured to the longitudinal lower support element 440 with second support connectors 417, 418.

Alternatively, the longitudinal lower support element 440 is omitted. The first vertical support element 402 is secured to the support surface, or the reactor 10 or the vacuum chamber 20 with the first support connectors 407, 408. The first vertical support element 402 extends upwards from the first support connectors 407, 408. The second vertical support element 412 is secured to the support surface, or the reactor 10 or the vacuum chamber 20 with the second support connectors 417, 418. The second vertical support element 412 extends upwards from the second support connectors 417, 418.

The door support frame further comprises one or more upper support elements 450. The upper support element(s) 450 are arranged to extend between the first and second vertical support elements 402, 412.

The upper support element 450 is preferably arranged to the extend in horizontal direction.

The upper support element 450 is arranged in vertical direction above the loading opening 25.

In a preferred embodiment, the upper support element 450 is arranged in vertical direction above the top wall 24 o the vacuum chamber 20.

The longitudinal lower support element 440 is further secured to the support surface, or the reactor 10 or the vacuum chamber 20. The first and second vertical support elements 402, 412 extend upwards from the longitudinal lower support element 440.

The first and second vertical support elements 402, 412 are arranged in connection with the loading wall 21 of the vacuum chamber 20 such that the first and second vertical support elements are on opposite sides of the loading opening 25 of the vacuum chamber 20. Accordingly, the loading opening 25 arranged between the first and second vertical support elements 402, 412.

Therefore, the first and second vertical support elements 402, 412 are arranged such that the loading opening 25 is provided to the loading space between the first and second vertical support elements 402, 412. In other words, the first and second vertical support elements 402, 412 are arranged such that the loading opening 25 is opposite the loading space between the first and second vertical support elements 402, 412.

In the embodiment of FIG. 5, the first and second vertical support elements 402, 412 are arranged on the front of the loading wall 21 of the vacuum chamber 20 such that the first and second vertical support elements are on opposite sides of the loading opening 25 of the vacuum chamber 20 and the loading opening 25 is opposite the loading space.

The reactor door 300 is supported to the first and second vertical support elements 402, 412 and arranged to the loading space between the first and second vertical support element 402, 412, as shown in FIG. 5. Therefore, the reactor door 300 is arranged to be placed to the first door position against the loading wall 21 or the sealing flange 30 for closing the loading opening 25.

Accordingly, both the reactor door 300 and the loading opening 25 are provided between the first and second vertical support elements 402, 412 and in the loading space.

The reactor door 300 is supported and connected to the first vertical support elements 402 with one or more first door support elements 421, 422. The reactor door 300 is further supported and connected to the second vertical support elements 412 with one or more second door support elements 431, 432.

The reactor door 300 is arranged movable to the first and second vertical support elements 402, 412. Accordingly, the reactor door 300 is arranged and supported movable along the longitudinal direction of the first and second vertical support elements 402, 412.

The door support structure comprises an upper end and a lower end, and the reactor door 300 is arranged movable to the first and second vertical support elements 402, 412 in a direction between the upper end and lower end of the door support structure.

Accordingly, the reactor door 300 is arranged movable between the second door position and the third door position in the door support structure and along the first and second vertical support elements 402, 412.

The upper end of the door support structure is provided by the first and second upper ends 406, 416 of the first and second vertical support elements 402, 412, or by the upper support element(s) 450. The lower end of the door support structure is provided by the first and second lower ends 404, 414 of the first and second vertical support elements 402, 412, or by the lower support element(s) 440, 407, 408, 417, 418.

The reactor door assembly comprises a door moving mechanism 409, 419 arranged to move the reactor door 300 along the door support structure 402, 412, 440, 450, or one or more vertical support elements 402, 412 thereof, in a direction between the upper end 406, 416, 450 and the lower end 404, 414, 440 of the door support structure 402, 412, 440, 450.

Preferably, the door moving mechanism 409, 419 is arranged to move the reactor door 300 along the first and second vertical support elements 402, 412 in a direction between first and second lower ends 404, 414 and first and second upper ends 406, 416 of the first and second vertical support elements 402, 412.

The door moving mechanism comprises one or more door moving devices 409, 419 arranged to move the reactor door 300 in the door support structure.

In the embodiment of FIG. 5, the door moving mechanism comprises a first door moving device 409 provided to the first vertical support element 402. The door moving mechanism comprises a second door moving device 419 provided to the second vertical support element 412.

Alternatively, the door moving mechanism comprises only one door moving device 409, 419.

The door moving device(s) 409, 419 are arranged to the door support structure or to the atomic layer deposition reactor 10.

In an alternative embodiment, the door moving device(s) 409, 419 is provided to the reactor door 300.

The door moving mechanism may be any kind of mechanical moving mechanism such as a tooth mechanism or a track mechanism. The door moving device 409, 419 may be an electric motor, or other kind of motor or a hydraulic or pneumatic device.

The first and second vertical support elements 402, 412 may be provided with transport tracks (not shown) extending along the longitudinal direction of the first and second vertical support elements 402, 412, or in a direction between the upper and lower ends 406, 416, 404, 414 thereof. The reactor door 300 is supported and connected to the transport tracks of the first and second vertical support elements 402, 412 with the one or more first door support elements 421, 422 and with the one or more second door support elements 431, 432.

Figure 6:
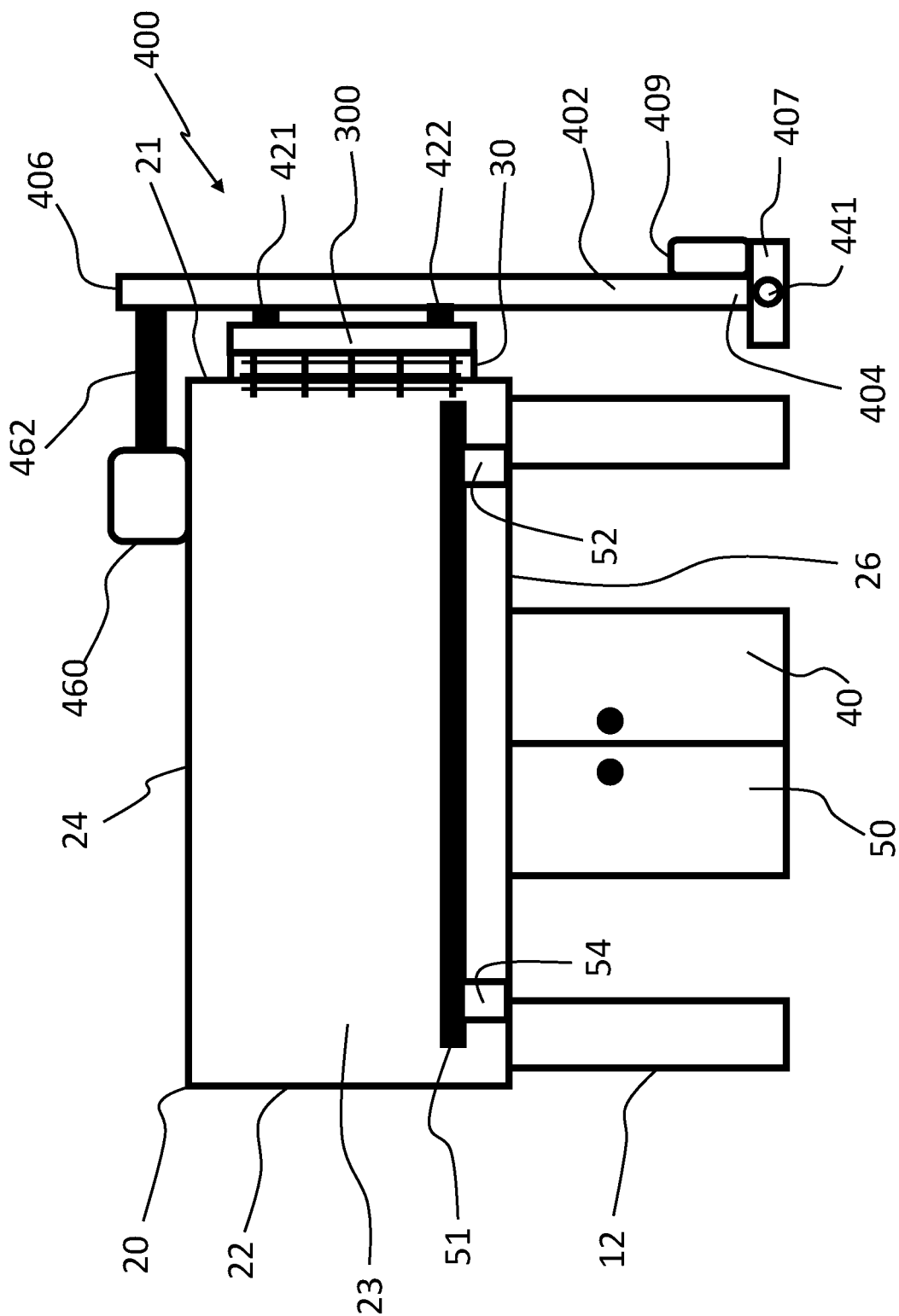

FIG. 6 shows a schematic side view of the atomic layer deposition reactor 10, the vacuum chamber 20 and the reactor door assembly 400 of FIG. 5. The first and second vertical support elements 402, 412 are pivotably connected to the lower support elements 407, 408, 417, 418, 440 and arranged to extend upwards from the one or more lower support elements 407, 408, 417, 418, 440. Thus, the first and second vertical support elements 402, 412 are arranged to be turned, inclined or tilted relative to the front surface 21 and the vacuum chamber 20.

The first and second vertical support elements 402, 412 are pivotably connected to the lower support elements 407, 408, 417, 418, 440 with one or more horizontal pivot axis 441 and arranged to be turned, inclined or tilted around the horizontal pivot axis 441 relative to the vertical direction and the loading wall 21 of the vacuum chamber 20.

As shown in FIG. 6, the first and second vertical support elements 402, 412 are pivotably connected to the first support connectors 407, 408 and the second support connectors 417, 418, respectively, with one or more horizontal pivot axis 441. Thus, the first and second vertical support elements 402, 412 are arranged to be turned, inclined or tilted relative to the loading wall 21 and the vacuum chamber 20 around the one or more horizontal pivot axis 441 relative to the vertical direction.

In the embodiment of FIGS. 5 and 6, a first horizontal pivot axis 441 is provided in connection with the first support connectors 407, 408 and the first vertical support element 402. A second horizontal pivot axis 441 is provided in connection with the second support connectors 417, 418 and the second vertical support element 412.

The reactor door assembly 400 further comprises support structure moving mechanism 460, 462 arranged to move the door support structure 402, 412, 440, 450 relative to the loading wall 21 and the atomic layer deposition reactor 10 towards and away from the loading wall 21 of the vacuum chamber 20.

The support structure moving mechanism comprises a support structure moving device 460, 462 arranged to move the door support structure 402, 412, 440, 450 relative to the atomic layer deposition reactor 10 towards and away from the loading wall 21 of the vacuum chamber 20.

The support structure moving mechanism comprises a support structure moving device 460, 462 arranged to turn, incline or tilt the door support structure 402, 412, 440, 450 relative to the atomic layer deposition reactor 10 towards and away from the loading wall 21 of the vacuum chamber 20 around the horizontal pivot axis 441.

In the embodiment of FIGS. 5 and 6, the support structure moving device 460, 462 is provided to the atomic layer deposition reactor 10 and connected to the door support structure 402, 412, 440, 450.

As shown in FIG. 6, the support structure moving device 460, 462 is arranged on the top wall 26 of the vacuum chamber 20 and connected to the door support structure.

The support structure moving device 460, 462 is connected to the upper support element 450. Alternatively, the support structure moving device 460, 462 is connected to the first and/or second vertical support elements 402, 412.

The support structure moving device 460, 462 may be any kind of device such as a motor, electric motor, or hydraulic or pneumatic device.

In the embodiment of FIGS. 5 and 6, the support structure moving device 460 is a hydraulic device comprising a hydraulic cylinder 462 connected to the door support structure.

The support structure moving mechanism 460, 462 is arranged to turn or tilt the first and second vertical support elements 402, 412 in relation to the one or more lower support elements 407, 408, 417, 418, 440 for moving the first and second vertical support elements 402, 412 and the reactor door 300 towards and away from the loading wall 21 of the vacuum chamber 20.

Accordingly, the support structure moving mechanism 460, 462 is arranged to turn or tilt the first and second vertical support elements 402, 412 around the one or more horizontal pivot axis 441 in relation to the one or more lower support elements 407, 408, 417, 418, 440 for moving the two or more vertical support elements 402, 412 and the reactor door 300 towards and away from the loading wall 21 of the vacuum chamber 20.

Thus, the support structure moving mechanism 460, 462 is arranged to push the first and second vertical support elements 402, 412 away from the loading wall 21 by tilting the first and second vertical support elements 402, 412 around the one or more horizontal pivot axis 441. The support structure moving mechanism 460, 462 is further arranged to pull the first and second vertical support elements 402, 412 towards from the loading wall 21 by tilting the first and second vertical support elements 402, 412 around the one or more horizontal pivot axis 441.

The support structure moving mechanism 460, 462 is arranged to turn the first and second vertical support elements 402, 412 in relation to the one or more lower support elements 407, 408, 417, 418, 440 to a first support structure position in which the reactor door 300 is against the loading wall 21 of the vacuum chamber 20 and the reactor door 300 is arranged to close the loading opening 25, 30, 32. The first support structure position is shown in FIG. 6. In the first support structure position the reactor door 300 is in the first door position as shown in FIG. 6.

The support structure moving mechanism 460, 462 is further arranged to turn the first and second vertical support elements 402, 412 in relation to the one or more lower support elements 407, 408, 417, 418, 440 to a second support structure position in which the reactor door 300 is spaced apart from the loading wall 21 of the vacuum chamber 20 such that the loading opening 25 is open. The second support structure position is shown in FIG. 7.

The door moving mechanism 409, 419 is arranged to move the reactor door 300 along the first and second vertical support elements 402, 412 in the loading space along the first and second vertical support elements 402, 412.

Figure 7:
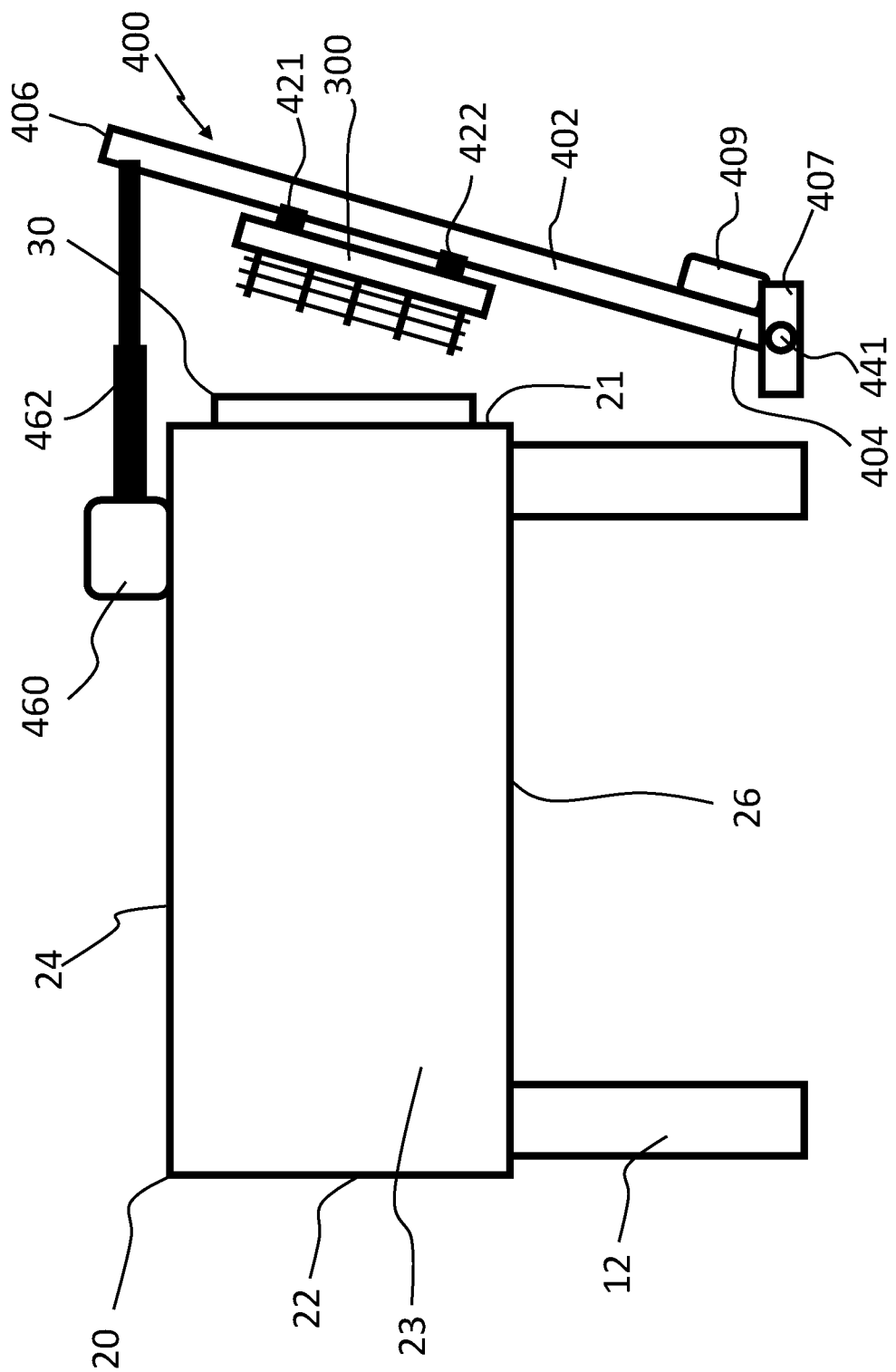

In the FIG. 7, the door support structure is in the second support structure position and the reactor door 300 in the second door position.

The door moving mechanism 409, 419 is arranged to move the reactor door 300 along the first and second vertical support elements 402, 412 in the loading space along the first and second vertical support elements 402, 412 between the second door position and the third door position.

Figure 8:
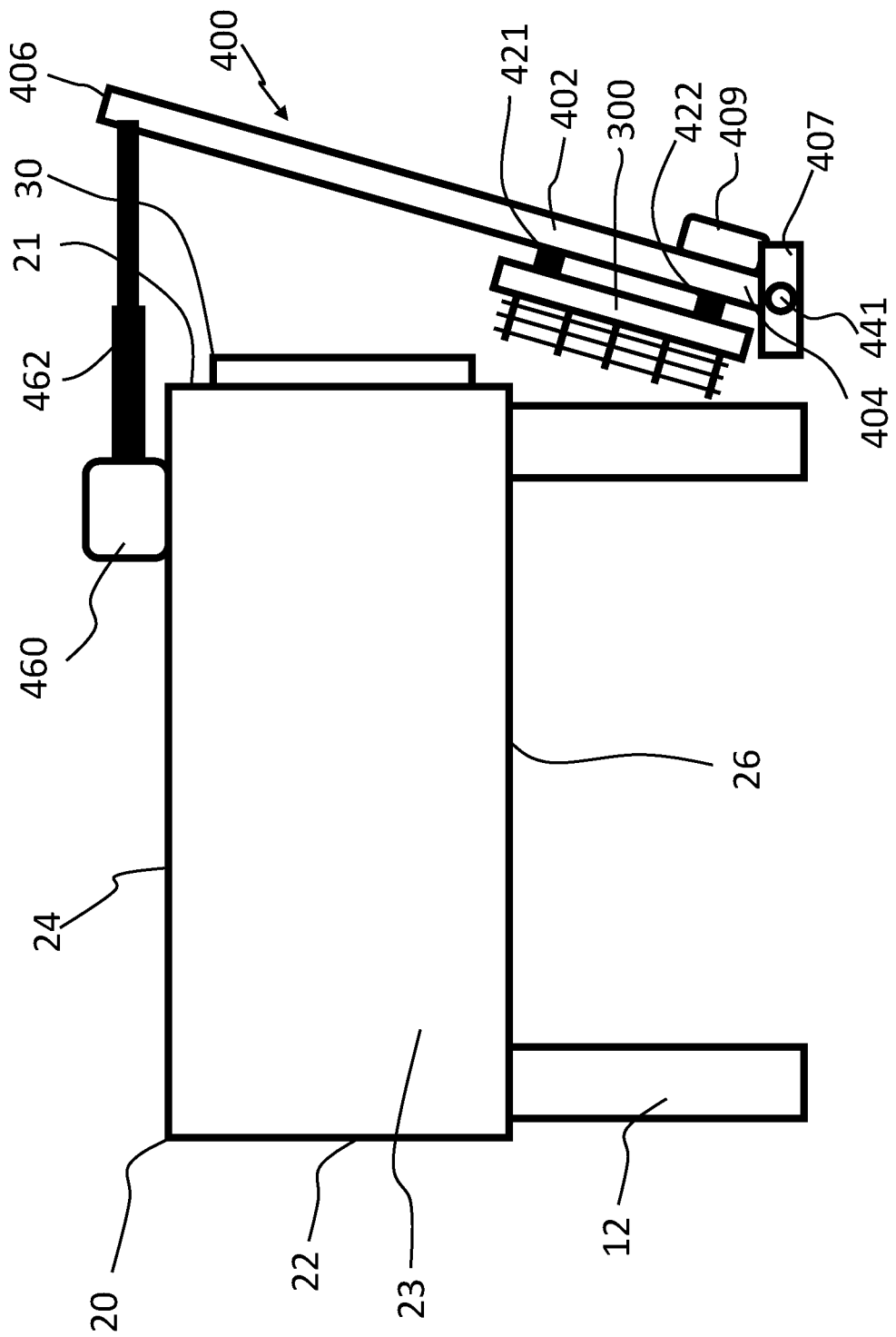
Figure 9:
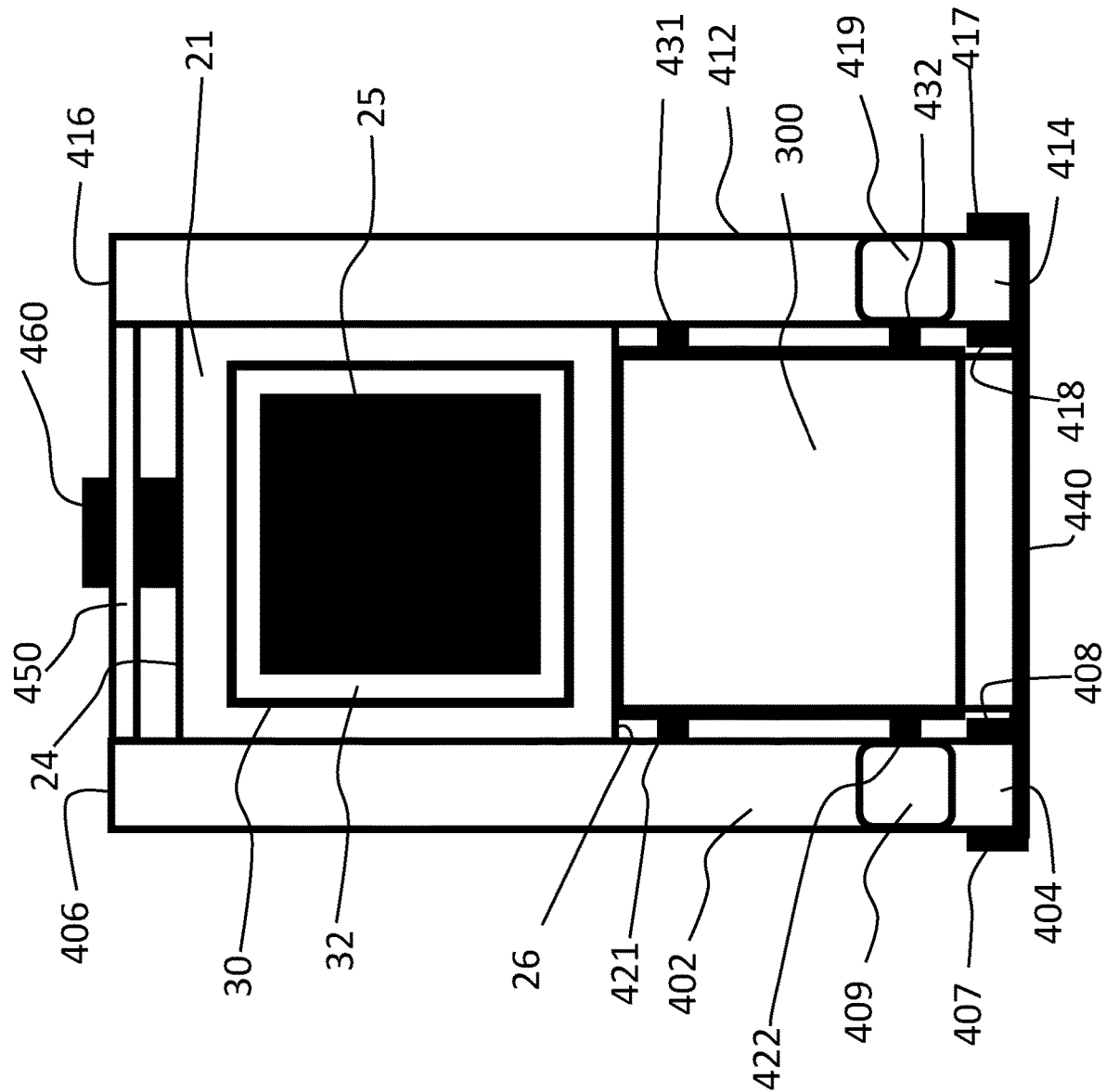

The door moving mechanism 409, 419 is further arranged to move the reactor door 300 along the first and second vertical support elements 402, 412 in the loading space between the first and second vertical support elements 402, 412 to the third door position in which the reactor door 300 is in vertical direction below the loading opening 25. The third door position is shown in FIGS. 8 and 9.

In the third door position and in the second support structure position, the loading space between the first and second vertical support elements 402, 412 and opposite the loading opening 25 is free. Accordingly, the reactor door 300 is moved aside from the loading opening 24 and from the front of the loading opening 25 and the loading wall 21. Thus, a separate reaction chamber or substrates may be loaded into the vacuum chamber 20 or unloaded from the vacuum chamber 20.

In the embodiment of FIGS. 5 to 9, a closed vacuum chamber 20 is opened by moving the door support structure, or the first and second vertical support elements 402, 412 thereof, with the support structure moving mechanism 460, 462 relative to the vacuum chamber from the first support structure position to the second support structure position with a first movement. The first movement is arranged to move the reactor door 300 from the first door position to the second door position relative to the vacuum chamber 20.

The first movement is arranged to tilt the first and second vertical support elements 402, 412 away from the loading wall 21 of the vacuum chamber 20.

In the first movement the reactor door 300 remains stationary in relation to the door support structure. Then the reactor door 300 is moved with the door moving mechanism 409, 419 in the door support structure, or along the first and second vertical support elements 402, 412, with a second movement from the second door position to the third door position.

The second movement is arranged to move the reactor door 300 along the first and second vertical support elements 402, 412 to the third door position in which the reactor door 300 below the loading opening 25.

During the second movement the door support structure is in the second support structure position.

In the embodiment of FIGS. 5 to 9, an open vacuum chamber 20 is closed by moving the reactor door 300 with the door moving mechanism 409, 419 with the second movement in the door support structure, or along the first end second vertical support elements 402, 412, from the third door position to the second door position.

The second movement is arranged to move the reactor door 300 along the first and second vertical support elements 402, 412 to the second door position in which the reactor door 300 spaced apart and opposite the loading opening 25 or the loading wall 21.

During the second movement the door support structure is in the second support structure position.

Then the door support structure, or the first and second vertical support elements 402, 412 thereof, is moved with the support structure moving mechanism 460, 462 relative to the vacuum chamber 20 from the second support structure position to the first support structure position with the first movement. The first movement is arranged to move the reactor door 300 from the second door position to the first door position relative to the vacuum chamber 20 for closing the loading opening 25.

The first movement is arranged to tilt the first and second vertical support elements 402, 412 towards the loading wall 21 of the vacuum chamber 20.

In the first movement the reactor door 300 remains stationary in relation to the door support structure.

In an alternative embodiment of FIGS. 5 to 9, the door support structure and the door moving mechanism 409, 419 are arranged to move the reactor door 300 with the second movement from the second door position to the third position in which the reactor door 300 is above the loading opening 25.

Thus, during opening of the loading opening 25, the reactor door 300 is moved with the door moving mechanism 460, 462 upwards along the door support structure, or the first and second vertical support elements 402, 412, with the second movement from the second door position to the third door position. During closing of the loading opening 25, the reactor door 300 is moved with the door moving mechanism 460, 462 downwards along the door support structure, or the first and second vertical support elements 402, 412 from the third door position to the second door position.

Figure 10:
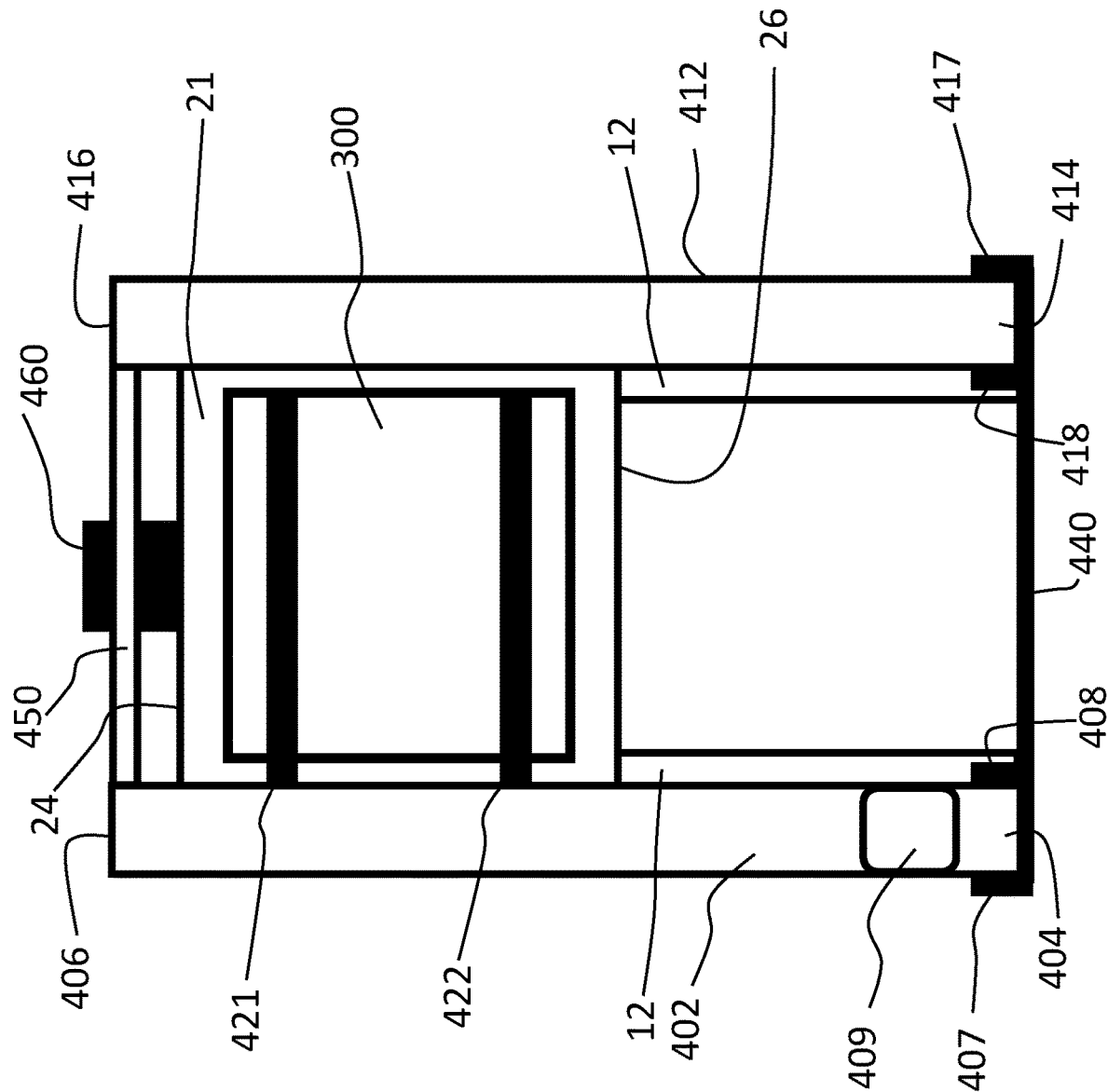
FIGS. 10 and 11 show schematically another embodiment of a reactor door assembly according to the present invention.
Figure 11:
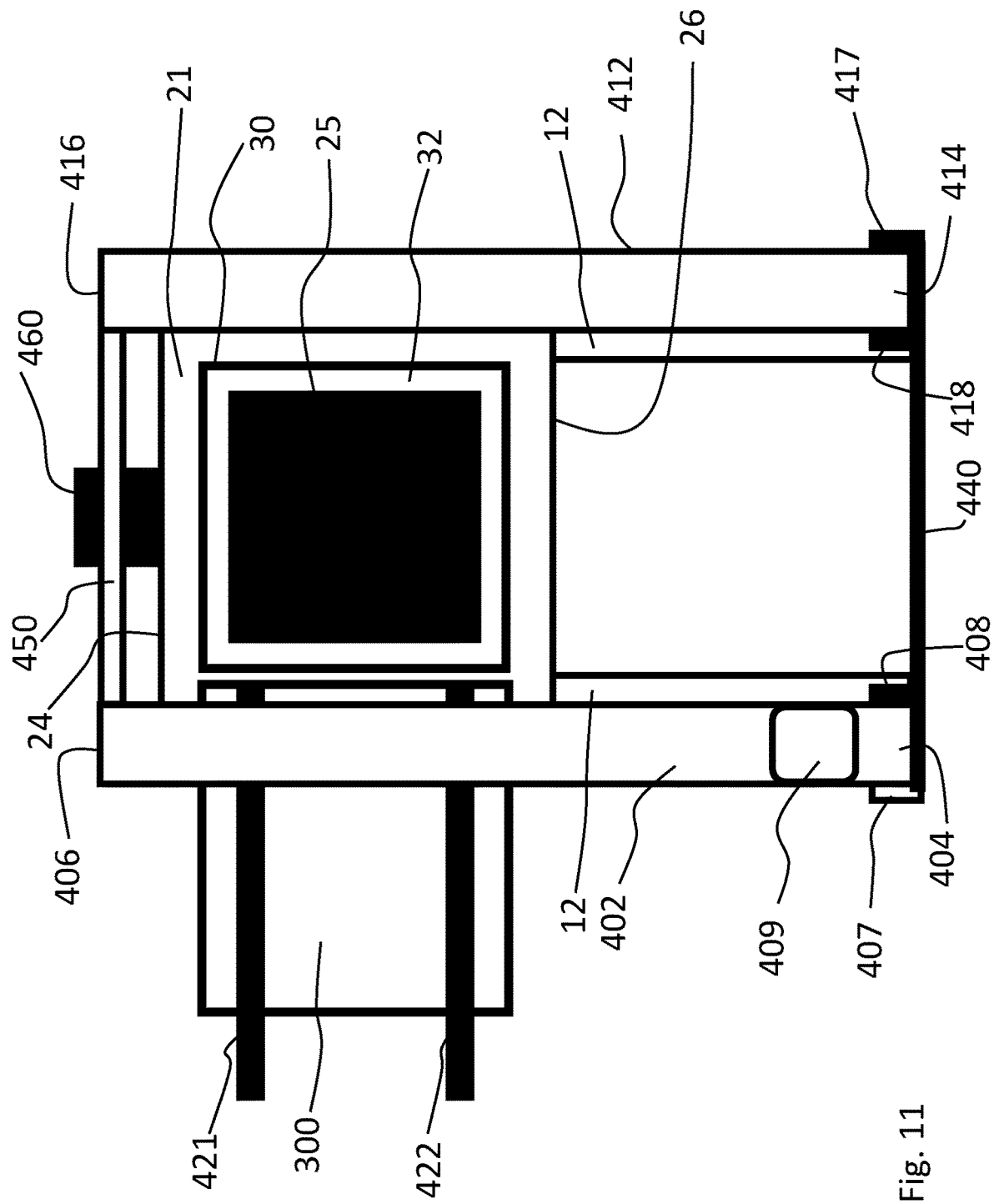

FIGS. 10 and 11 show an alternative embodiment. In this embodiment the door moving mechanism 409 is arranged to move the reactor door 300 in the door support structure 402, 412, 440, 450, or in the first vertical support element 402 thereof, in a direction transverse to the direction between the upper end 406, 450 and the lower end 404, 440 of the door support structure 402, 412, 440, 450.

Preferably, the door moving mechanism 409 is arranged to move the reactor door 300 transverse to or perpendicularly to longitudinal direction of the first and vertical support elements 402, 412 between first lower end 404 and first upper end 406 of the first vertical support element 402.

Accordingly, in the embodiment of FIGS. 10 and 11 the door moving mechanism 409 is arranged to move the reactor door 300 in the door support structure in horizontal direction, or in a direction transverse to vertical direction.

The door moving mechanism comprises one or more door moving devices 409 arranged to move the reactor door 300 in the door support structure.

The door moving device (s) 409 are arranged to the door support structure or to the atomic layer deposition reactor 10 or to the reactor door 300.

The door moving mechanism may be any kind of mechanical moving mechanism such as a tooth mechanism or a track mechanism. The door moving device 409 may be an electric motor, or other kind of motor or a hydraulic or pneumatic device.

In the embodiment, of FIGS. 10 and 11 the reactor door 300 is supported to the door support structure, and to the first vertical support element 402, with the first door support elements 421, 422.

The first door support elements 421, 422 are arranged to form moving tracks for moving the reactor door 300 in the door support structure with the second movement laterally aside from loading opening 25.

In the embodiment of FIGS. 10 and 11, the door support structure and the support structure moving mechanism is similar to embodiment of FIGS. 5 to 9.

In an alternative embodiment, the second vertical support element 412 and thus the second support connectors 417, 418 are omitted.

In the embodiment of FIGS. 10 to 11, a closed vacuum chamber 20 is opened by moving the door support structure, or the first and second vertical support elements 402, 412 thereof, with the support structure moving mechanism 460, 462 relative to the vacuum chamber from the first support structure position to the second support structure position with the first movement, as in FIGS. 5 to 9.

Then the reactor door 300 is moved with the door moving mechanism 409 in the door support structure, or transversely or horizontally in the first vertical support element 402, with the second movement from the second door position to the third door position.

The second movement is arranged to move the reactor door 300 horizontally or transversely to the first vertical support element 402 to the third door position in which the reactor door 300 laterally aside from the loading opening 25, a shown in FIG. 11.

During the second movement the door support structure is in the second support structure position.

In the embodiment of FIGS. 10 and 11, an open vacuum chamber 20 is closed by moving the reactor door 300 horizontally or transversely to the first vertical support element 402 with the door moving mechanism 409 and with the second movement in the door support structure from the third door position to the second door position in which the reactor door 300 is spaced and opposite the loading wall 21 and the loading opening 25.

During the second movement the door support structure is in the second support structure position.

Then the door support structure is moved with the support structure moving mechanism 460, 462 relative to the vacuum chamber 20 from the second support structure position to the first support structure position with the first movement. The first movement is arranged to move the reactor door 300 from the second door position to the first door position relative to the vacuum chamber 20 for closing the loading opening 25, similarly as in FIGS. 5 to 9.

Figure 12:
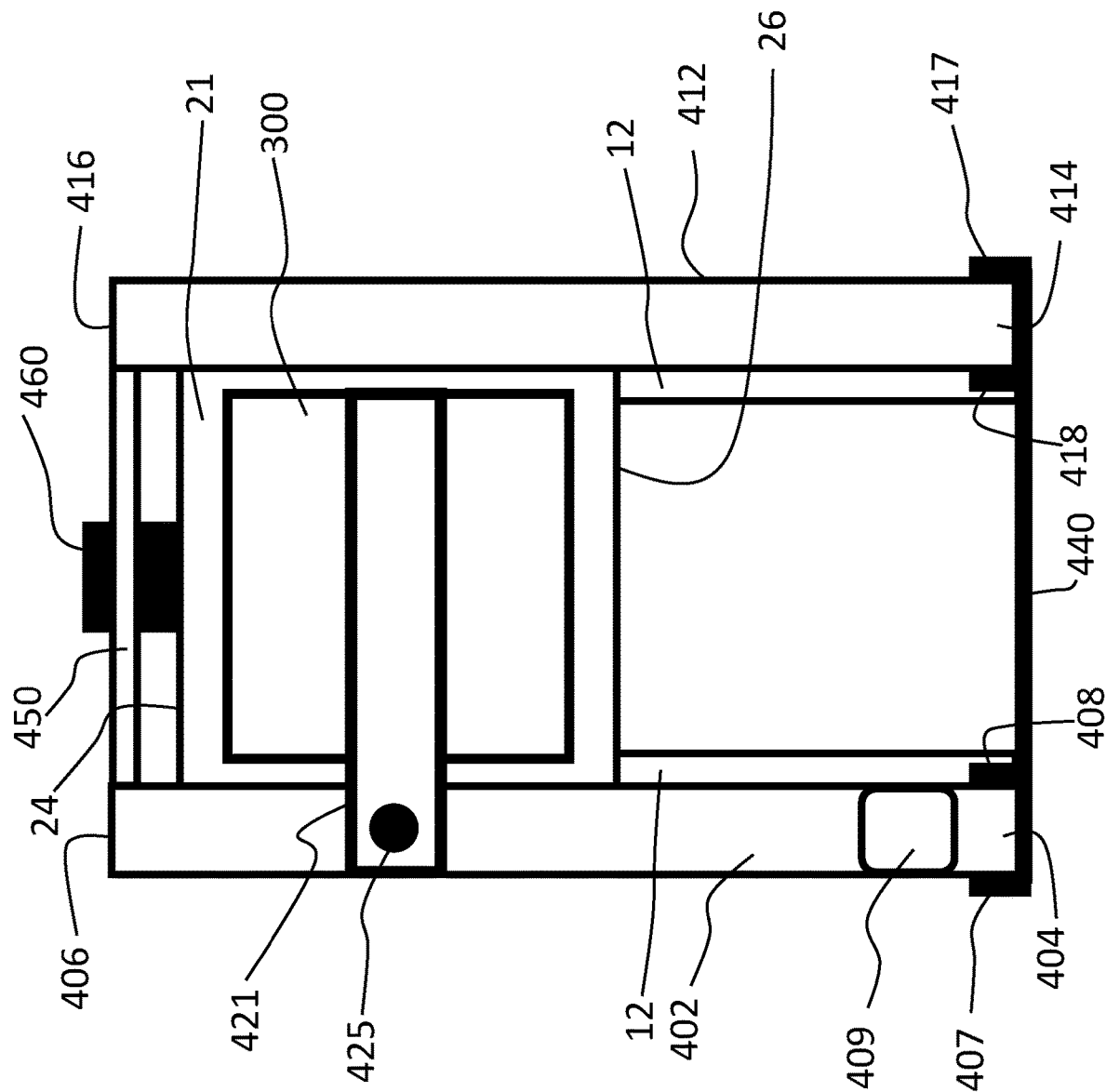
FIGS. 12 and 13 show schematically a further embodiment of a reactor door assembly according to the present invention.
Figure 13:
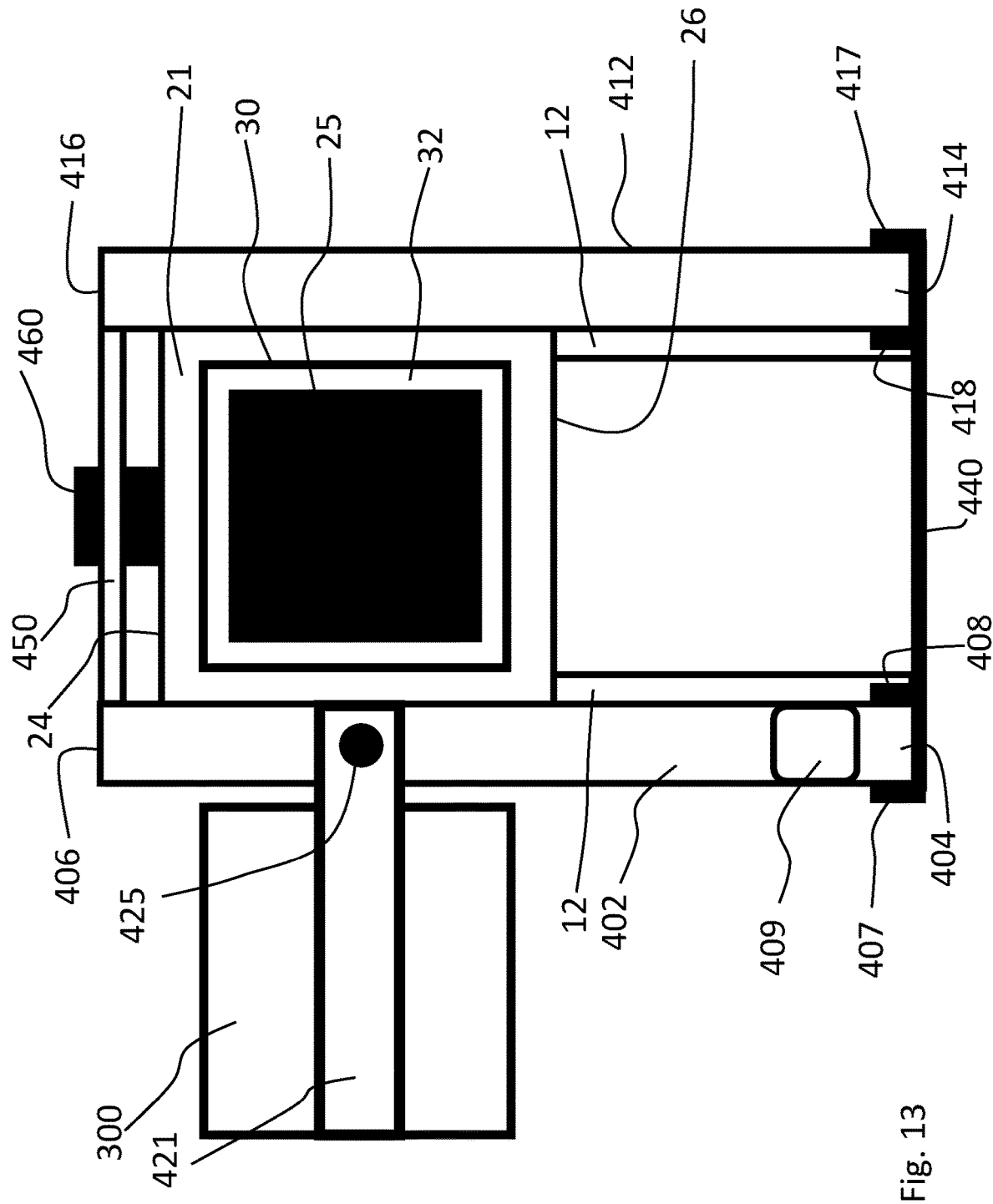

FIGS. 12 and 13 show an alternative embodiment. In this embodiment the door support structure and the support structure moving mechanism 460, 462 are similar to the embodiment of FIGS. 5 to 9. Therefore, also the first movement of the door support structure between the first support structure position and the second support structure position, and thus the moving the reactor door 300 between the first door position and the second door position, are similar to the embodiment of FIGS. 5 to 9.

It should be noted that in this embodiment the second vertical support element 412 could also be omitted.

In this embodiment, the reactor door assembly 400 comprises a door moving mechanism 409, 421, 425 arranged to turn the reactor door 300 around a door axis 425 in the door support structure 402, 412, 440, 450 relative to the door support structure 402, 412, 440, 450 and relative to the vacuum chamber 20 between the second door position and the third door position.

The reactor door 300 is supported to the door support structure 402, 412, 440, 450 with the first door support element 412. The door moving mechanism comprises the door axis 425 arranged between the reactor door 300 and the door support structure 402, 412, 440, 450. The reactor door 300 is arranged to turn around the door axis 425 relative to the door support structure 402, 412, 440, 450.

As shown in FIGS. 12 and 13, the door axis 425 is connected between the door support structure and the door support element 421.

The reactor door 300 is turned around the door axis 425 with the first door moving device 409. Turning the reactor door 300 around the door axis 425 provides the second movement in which the reactor door is moved between the second door position and the third door position.

The door axis 425 is arranged to extend in perpendicularly or transversely to the longitudinal direction of the first vertical support element 402 between the lower upper end 404 and the first upper end 406.

The door axis 425 extends perpendicularly to the door surface 302.

Accordingly, the reactor door 300 is turned around the door axis in the direction of the door surface 302 or in lateral direction.

FIG. 12 shows the door support structure 402, 412, 440, 450 in the second support structure position and the reactor door 300 is in the second door position in which the rector door 300 is spaced apart and opposite loading opening 25. Thus, the door support structure 402, 412, 440, 450 is moved with the first movement.

Then, the reactor door 300 is moved with the second movement around the door axis 425 relative to the door support structure from the second door position to the third door position. The second movement is a rotation second movement around the door axis 425.

The reactor door 300 is moved to the third door position laterally aside from the loading opening 25, as shown in FIG. 13.

When closing the loading door 300, the reactor door 300 is turned from the third door position around the door axis 425 to the second door position. Then the first movement with the door support structure is carried out. to the first support structure position.

Figure 14:
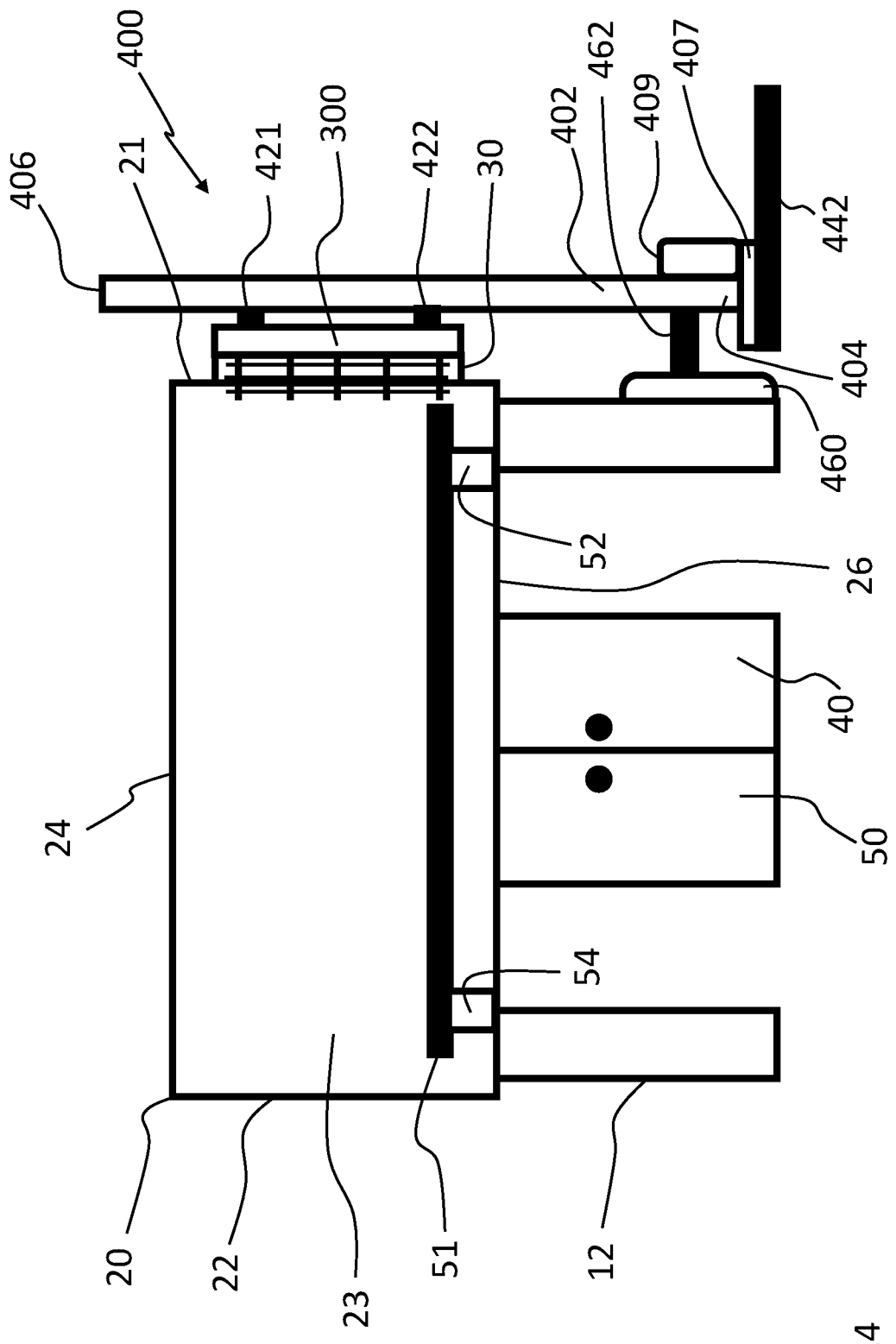
FIGS. 14 and 15 show schematically yet another embodiment of a reactor door assembly according to the present invention.
Figure 15:
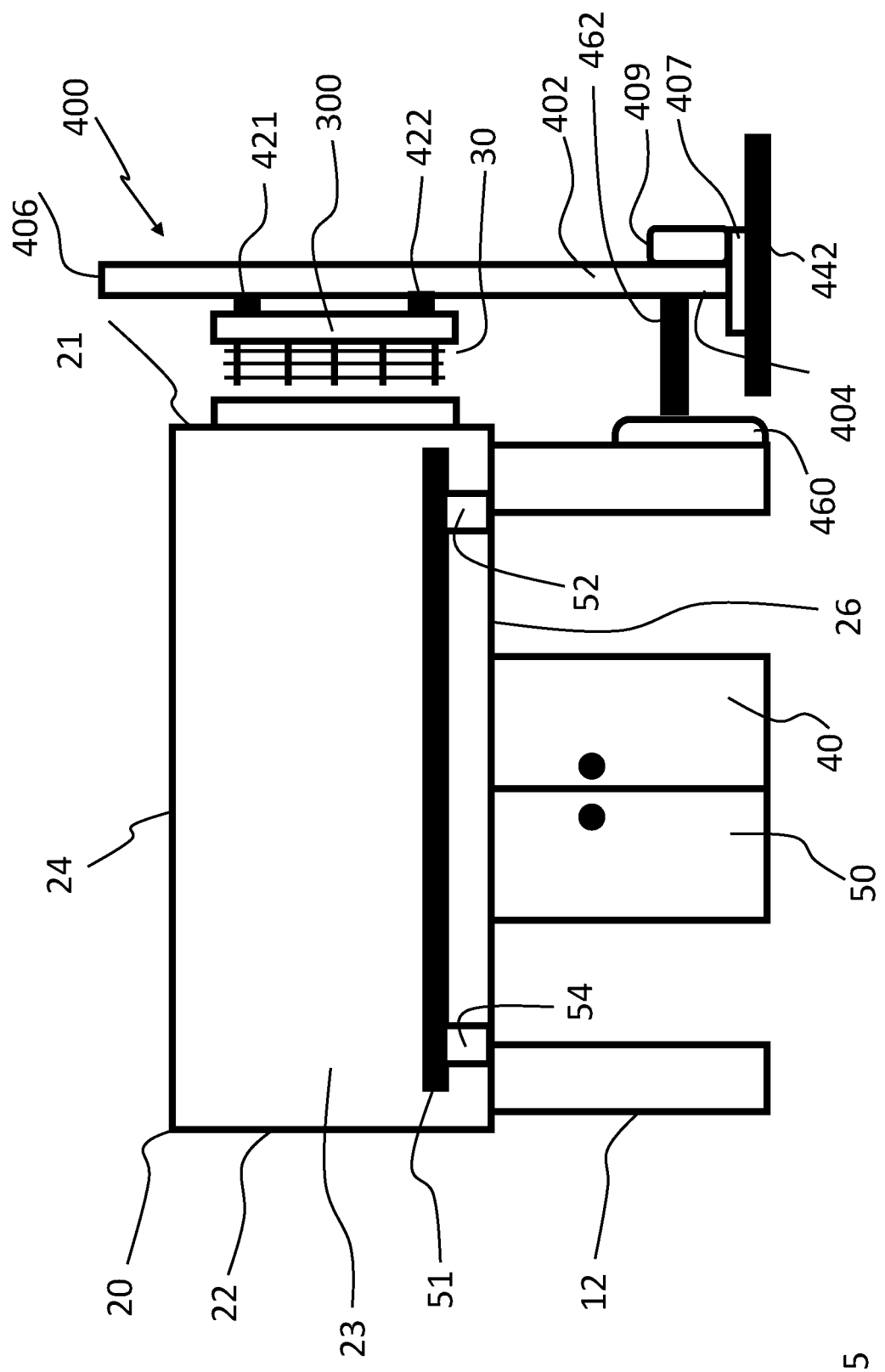

FIGS. 14 and 15 show an alternative embodiment. In this embodiment, the door support structure 402, 412, 440, 450 provided movable towards and away from the vacuum chamber 20 and the loading wall 21 thereof. Therefore, the support structure moving mechanism is arranged to be transported towards and away from the loading wall 21 between the first support structure position and the second support structure position. At the same time the reactor door 300 is moved between the first door position and the second door position.

As shown in FIGS. 13 and 14, the support structure moving mechanism 460, 462, 442 is arranged move the door support structure with a linear first movement towards and away from the vacuum chamber 20 and the loading wall 21. The door support structure is connected to a transport track 442 and the support moving device 460, 462 is arranged to move the door support structure along the transport track 442 towards and away from the loading wall 21.

FIG. 14 shows the support structure in the first support structure position and the reactor door 300 in the first door position. The support structure moving device 460, 462 pushes the door support structure away from the loading wall 21 to the second support structure position, shown in FIG. 15, with the first movement. Similarly, the support structure moving device 460, 462 pulls the door support structure towards the loading wall 21 to the first support structure position, shown in FIG. 14, with the first movement.

The door moving mechanism and the second movement of the reactor door 300 relative to the door support structure according to any of the embodiments of FIGS. 5 to 13.

Figure 16:
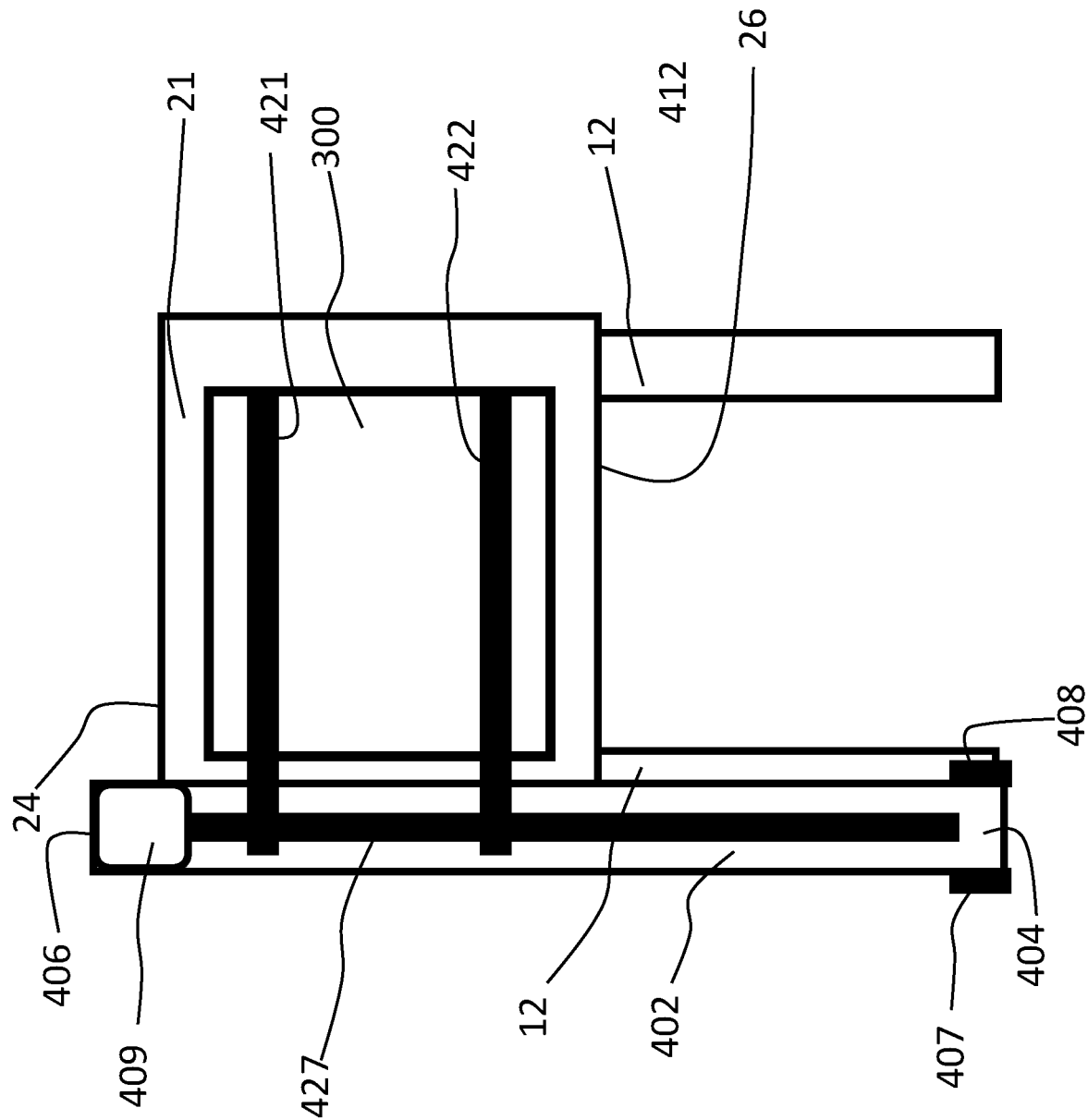
FIGS. 16 to 20 show schematically an alternative embodiment of a reactor door assembly according to the present invention.
Figure 17:
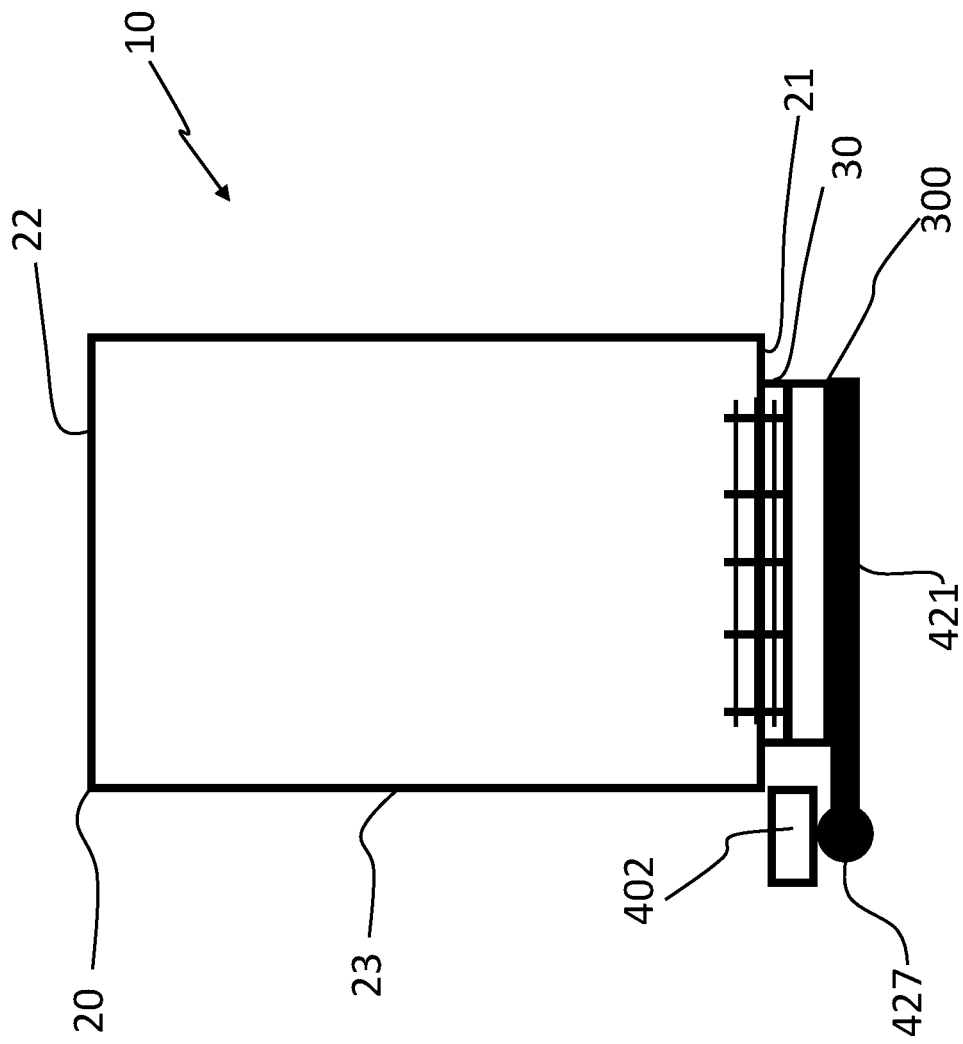
Figure 18:
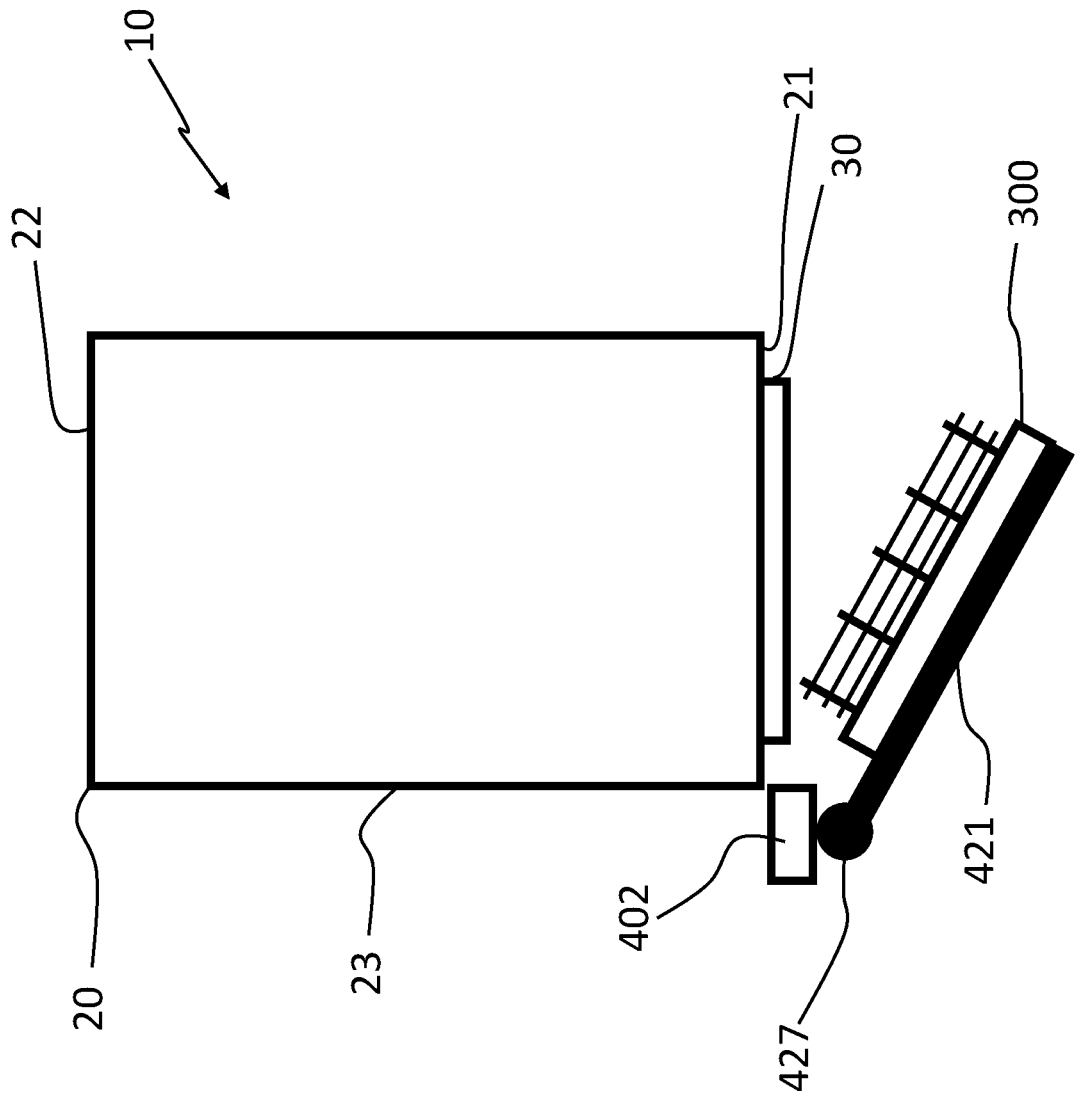

FIGS. 16 to 18 show a further embodiment of the reactor door assembly 400. In this embodiment, the door support structure comprises the first vertical support element 402. The reactor door 300 is connected and supported to the vertical support element 402.

The vertical support element 402 is supported to the support surface, such as facility floor, with the first lower support elements 407, 408.

Alternatively, door support structure is secured or supported to the atomic layer deposition apparatus 10 or the vacuum chamber 20.

In the embodiment of FIGS. 16 to 18, the door support structure is provided stationary in relation to the vacuum chamber 20. The reactor door 300 is supported to the door support structure or the first vertical support element 402 with first door support elements 421, 422.

The reactor door assembly 400 further comprises door moving mechanism 409, 427 arranged to move the reactor door 300 in the door support structure. The door moving mechanism comprises one or more moving devices 409, as disclosed above, for moving the reactor door 300.

In this embodiment, the door moving mechanism comprises a moving axis 427. The moving axis 427 extend in vertical direction or in a direction of the surface of the loading wall 21.

The reactor door 300 is supported rotatably to the moving axis 427 with the first door support elements 421, 422.

FIG. 16 shows the reactor door 300 in the first door position. The door moving mechanism 409, 427 is arranged to move and turn reactor door 300 between the first door position and the second door position around the moving axis. FIG. 17 shows the reactor door 300 in the first door position in an upper view.

FIG. 18 shows the reactor door 300 in the second door position in which the reactor door 300 is spaced apart and opposite the loading opening 25. The reactor door 300 is turned with the first movement such that the reactor door is disengaged from the loading wall 21, and also the heat reflector plates 306 are out of the loading opening 25, as shown in FIG. 18.

Figure 19:
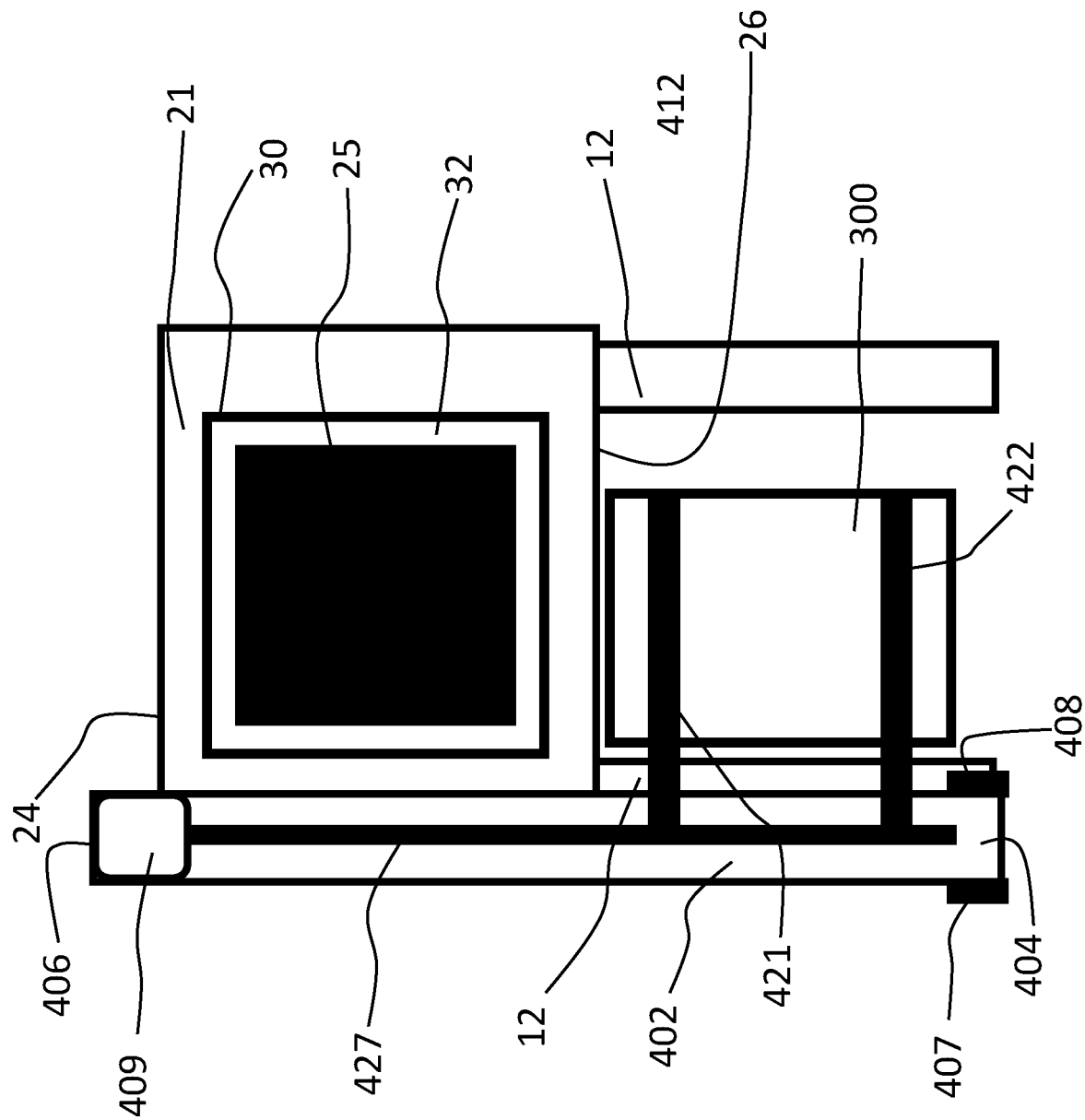

The door moving mechanism is further arranged to move the reactor door 300 between the second door position and the third door position along the moving axis 427 with the second movement. Thus, the moving axis 427 is arranged to form a door moving track. In the embodiment of FIG. 19, the reactor door 300 is moved with the second movement downwards below the loading opening 25 to the third door position. Accordingly, in this embodiment the reactor door 300 is arranged to be moved along the moving axis 427 to the third door position below the loading opening 25.

Figure 20:
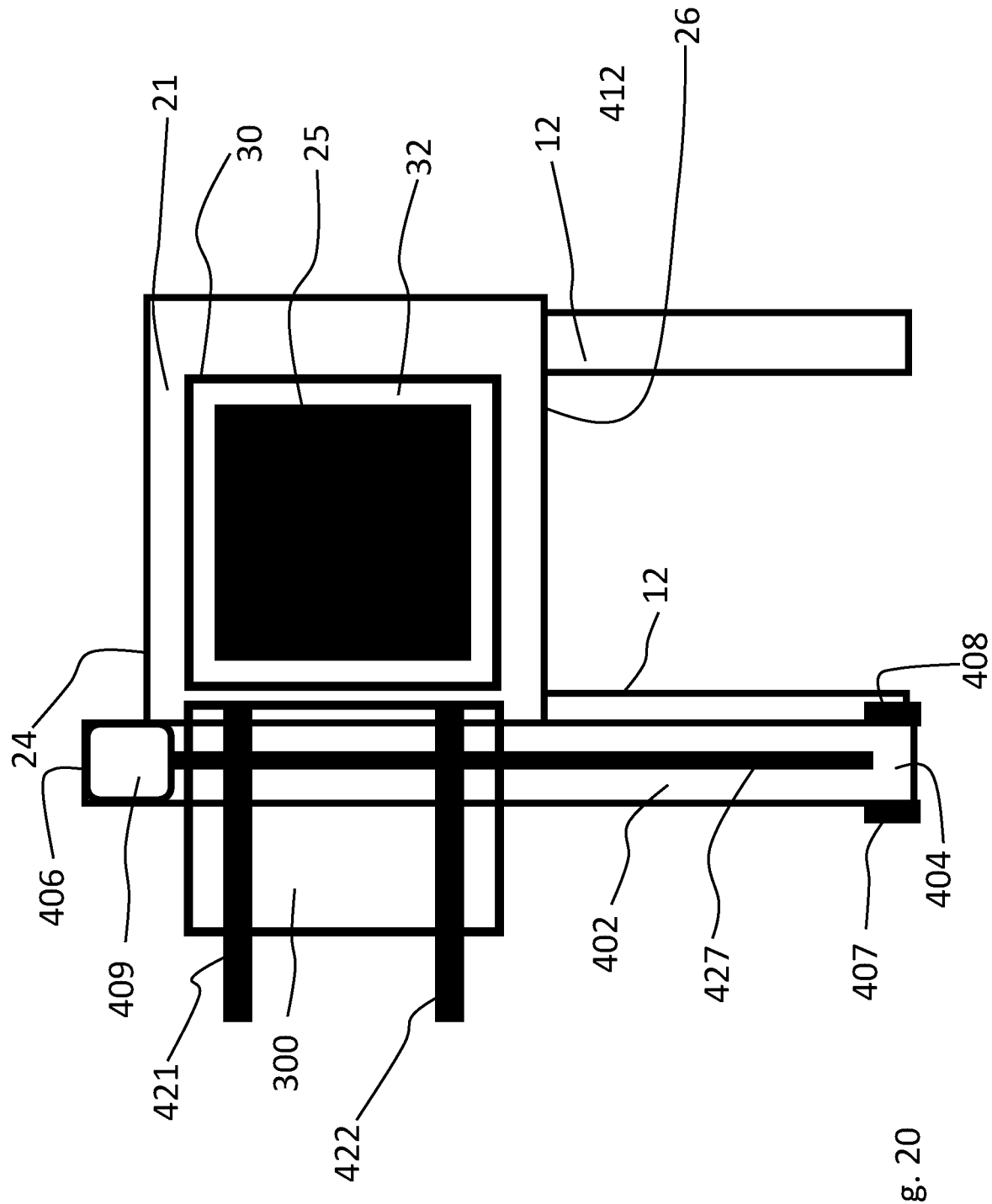

FIG. 20 shows a modification of the embodiment of FIGS. 16 to 19. In this embodiment, the reactor door 300 is arranged to be moved with the second movement between the second door position and the third door position in lateral direction. The door moving mechanism is further arranged to move the reactor door 300 between the second door position and the third door position with the second movement in a direction perpendicular or transverse to the moving axis 427.

Figure 21:
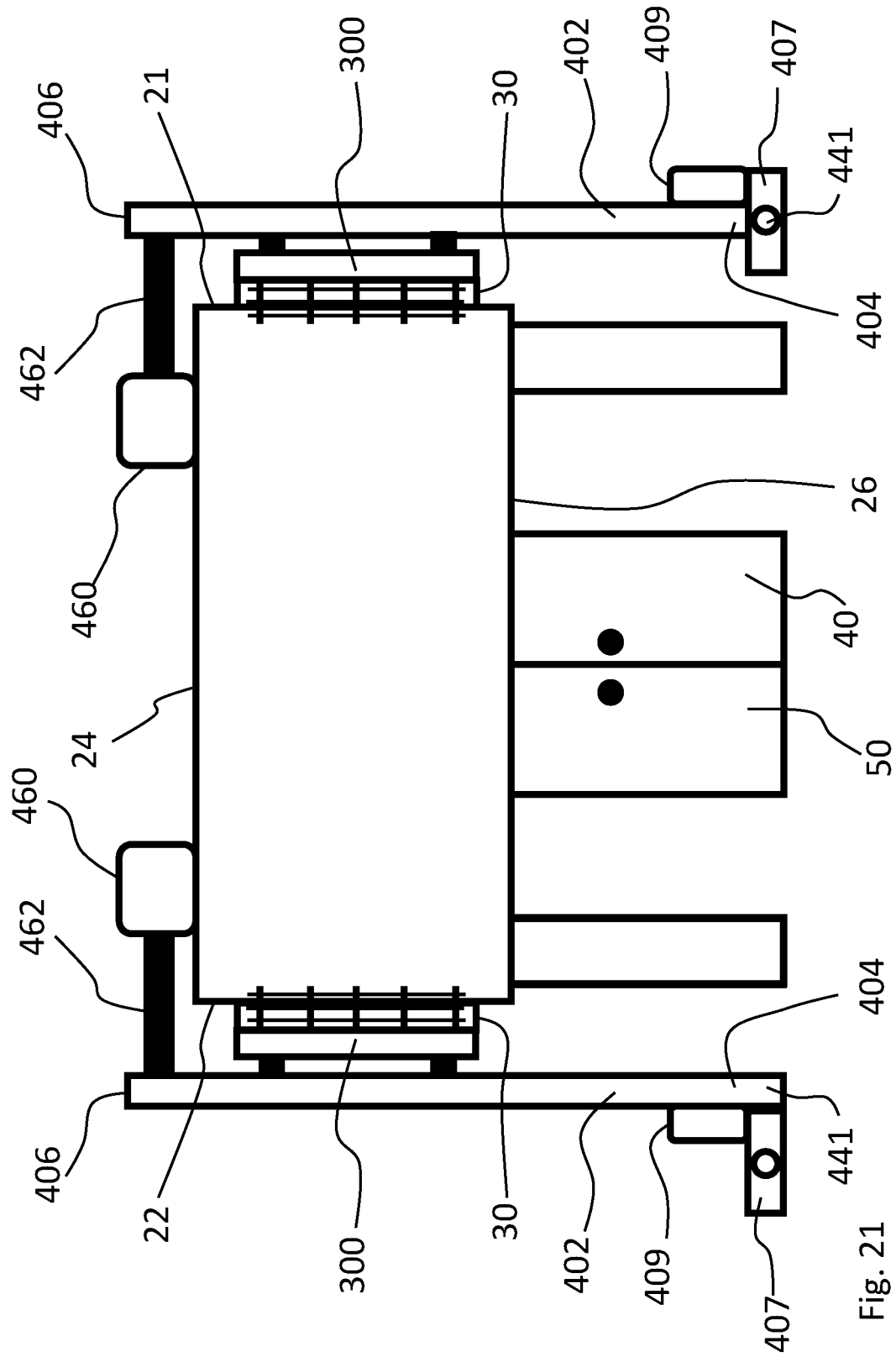
FIG. 21 shows schematically an embodiment in which the reactor door assembly is provided on opposite ends of the vacuum chamber.

FIG. 21 shows an embodiment of the atomic layer deposition reactor, in which the front wall 21 and the opposite back wall 22 of the vacuum chamber 20 are both provided with loading openings 25 and with reactor door assemblies 400. This allows the separate reaction chambers 100 or substrates to be loaded and unloaded from two directions or transporting the reaction chambers 100 or substrates through the vacuum chamber 20

The invention has been described above with reference to the examples shown in the figures. However, the invention is in no way restricted to the above examples but may vary within the scope of the claims.

The invention claimed is:

1. An atomic layer deposition reactor, the atomic layer deposition reactor comprising:
   a vacuum chamber comprising a loading wall provided with a loading opening; and
   a reactor door assembly comprising a reactor door for closing the loading opening of the vacuum chamber, and a door support structure operatively coupled to the reactor door,
   wherein:
   the reactor door assembly is configured to move the reactor door in relation to the vacuum chamber between a first door position in which the reactor door is against the loading wall of the vacuum chamber, and a second door position in which the reactor door is spaced apart from and opposite the loading wall of the vacuum chamber; and
   the reactor door assembly is configured to move the reactor door in relation to the vacuum chamber between the second door position, and a third door position in which the reactor door is aside the loading opening; and
   wherein:
   the door support structure comprises a first vertical support element and a second vertical support element, the first vertical support element and the second vertical support element being spaced apart from each other such that a loading space is formed between the first vertical support element and the second vertical support element, and the reactor door is operatively coupled to the first vertical support element and the second vertical support element and is arranged to the loading space between the first vertical support element and the second vertical support element; or
   the door support structure comprises a first vertical support element and a second vertical support element, the first vertical support element and the second vertical support element are arranged and spaced apart from each other such that a loading space is formed between the first vertical support element and the second vertical support element, the first vertical support element and the second vertical support element being operatively coupled to the loading wall of the vacuum chamber such that the first vertical support element and the second vertical support element are disposed on opposite sides of the loading opening of the vacuum chamber, and the reactor door is supported to the first vertical support element and the second vertical support element and arranged to the loading space between the first vertical support element and the second vertical support element.

2. The atomic layer deposition reactor according to claim 1, wherein:
   the loading opening defining an opening centre axis extending along a length of the loading opening,
   in second door position, the reactor door is spaced apart from the loading opening in a direction of the opening centre axis, and
   in the third door position, the reactor door is laterally aside the loading opening.

3. The atomic layer deposition reactor according to claim 1, wherein:
   the reactor door assembly is configured to move the reactor door between the first door position and the second door position with a first linear movement, and
   the reactor door assembly is configured to move the reactor door between the second door position and the third door position with a second linear movement transverse to the first linear movement; or
   the reactor door assembly is configured to move the reactor door between the first door position and the second door position with a first linear movement, and
   the reactor door assembly is configured to move the reactor door between the second door position and the third door position with a second rotational movement transverse to the first linear movement; or
   the reactor door assembly is configured to move the reactor door between the first door position and the second door position with a first rotational movement, and the reactor door assembly is configured to move the reactor door between the second door position and the third door position with a second linear movement; or the reactor door assembly is configured to move the reactor door between the first door position and the second door position with a first rotational movement, and the reactor door assembly is configured to move the reactor door between the second door position and the third door position with a second rotational movement.

4. The atomic layer deposition reactor according to claim 1, wherein:

the door support structure is configured to be stationary in relation to the vacuum chamber, the reactor door is configured to be movable in relation to the door support structure, and the reactor door assembly is configured to move the reactor door in the door support structure between the first door position and second door position, and between the second door position and third door position; or the door support structure is configured to be movable in relation to the vacuum chamber, the reactor door is configured to be stationary in relation to the door support structure, and the reactor door assembly is configured to move the door support structure in relation to the vacuum chamber such that the reactor door is moved between the first door position and second door position, and between the second door position and third door position; or the door support structure is configured to be movable in relation to the vacuum chamber, the reactor door is configured to be movable in relation to the door support structure, the reactor door assembly is configured to move the door support structure in relation to the vacuum chamber such that the reactor door is moved between the first door position and second door position, the reactor door assembly is configured to move the reactor door in the door support structure between the second door position and third door position; or the door support structure is configured to be movable in relation to the vacuum chamber, the reactor door is configured to be movable in relation to the door support structure, the reactor door assembly is configured to move the reactor door in the door support structure between the first door position and second door position, and the reactor door assembly is configured to move the door support structure in relation to the vacuum chamber such that the reactor door is moved between the second door position and third door position.

5. The atomic layer deposition reactor according to claim 1, wherein the reactor door assembly comprises a support structure moving mechanism configured to move the door support structure relative to the vacuum chamber towards and away from the loading wall of the vacuum chamber for moving the reactor door between the first door position and the second door position.

6. The atomic layer deposition reactor according to claim 5, wherein:

the support structure moving mechanism is configured to move the door support structure relative to the vacuum chamber towards and away from the loading wall of the vacuum chamber between a first support structure position and a second support structure position for moving the reactor door between the first door position and the second door position; or the support structure moving mechanism is provided with a horizontal pivot axis, the support structure moving mechanism is arranged to tilt the door support structure around the horizontal pivot axis relative to the vacuum chamber towards and away from the loading wall of the vacuum chamber between a first support structure position and a second support structure position for moving the reactor door between the first door position and the second door position; or the support structure moving mechanism is provided with a vertical pivot axis, the support structure moving mechanism is arranged to turn the door support structure around the vertical pivot axis relative to the vacuum chamber towards and away from the loading wall of the vacuum chamber between a first support structure position and a second support structure position for moving the reactor door between the first door position and the second door position.

7. The atomic layer deposition reactor according to claim 6, wherein:

the door support structure comprises one or more lower support elements, at least one of the first vertical support element or the second vertical support element being pivotably connected to the one or more lower support elements with one or more horizontal pivot axes disposed to extend away from the one or more lower support elements, the reactor door being operatively coupled to at least one of the first vertical support element or the second vertical support element; or the door support structure comprises one or more vertical pivot axes, the reactor door being operatively coupled to at least one of the first vertical support element or the second vertical support element; or the reactor door being operatively coupled to at least one of the first vertical support element or the second vertical support element.

8. The atomic layer deposition reactor according to claim 1, wherein the reactor door is operatively coupled to the door support structure, and wherein the reactor door assembly comprises a door moving mechanism configured to move the reactor door in the door support structure relative to the door support structure between the second door position and the third door position.

9. The atomic layer deposition reactor according to claim 8, wherein:

the door moving mechanism is configured to move the reactor door in the door support structure relative to the door support structure in a direction of a planar door surface of the loading door between the second door position and the third door position; or the door moving mechanism is configured to move the reactor door in the door support structure relative to the door support structure with the second linear movement between the second door position and the third door position; or the door moving mechanism is configured to move the reactor door in the door support structure relative to the door support structure with the second linear movement in a direction of a planar door surface of the loading door between the second door position and the third door position; or the door moving mechanism comprises a door axis which is configured to rotate the reactor door in the door support structure around the door axis relative to the door support structure with the second rotational movement between the second door position and the third door position; or the door moving mechanism comprises a door axis extending perpendicularly to a planar door surface of the loading door, and the door moving mechanism is configured to turn the reactor door in the door support structure around the door axis relative to the door support structure with the second rotational movement between the second door position and the third door position.

10. The atomic layer deposition reactor according to claim 8, wherein the door support structure comprises one or more lower support elements, and:
- the door moving mechanism is configured to move the reactor door relative to at least one of the first vertical support element or the second vertical support element between the second door position and the third door position; or
- the door moving mechanism is arranged to move the reactor door relative to at least one of the first vertical support element or the second vertical support element between the second door position in which the reactor door is spaced apart from the loading wall of the vacuum chamber and the third door position in which the reactor door is below, above or laterally adjacent the loading opening.

* * * * *